(12) United States Patent
Park

(10) Patent No.: US 10,937,729 B2
(45) Date of Patent: *Mar. 2, 2021

(54) INTEGRATED CIRCUIT DEVICES AND METHODS OF MANUFACTURING THE SAME

(71) Applicant: Samsung Electronics Co., Ltd., Suwon-si (KR)

(72) Inventor: Seok-han Park, Seongnam-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 16/714,953

(22) Filed: Dec. 16, 2019

(65) Prior Publication Data

US 2020/0118920 A1    Apr. 16, 2020

Related U.S. Application Data

(63) Continuation of application No. 16/005,850, filed on Jun. 12, 2018, now Pat. No. 10,546,810.

(30) Foreign Application Priority Data

Oct. 20, 2017    (KR) .................. 10-2017-0136600

(51) Int. Cl.
*H01L 23/522*    (2006.01)
*H01L 21/311*    (2006.01)
(Continued)

(52) U.S. Cl.
CPC ...... *H01L 23/5222* (2013.01); *H01L 21/0273* (2013.01); *H01L 21/02118* (2013.01);
(Continued)

(58) Field of Classification Search
CPC .......... H01L 23/5222; H01L 21/0273; H01L 21/3081; H01L 21/31144
See application file for complete search history.

(56) References Cited

U.S. PATENT DOCUMENTS 7,041,571 B2    5/2006  Strane
7,148,555 B2   12/2006  Yates et al.
(Continued)

FOREIGN PATENT DOCUMENTS

KR    10-2013-0010298    1/2013
KR    10-1517851         4/2015
(Continued)

OTHER PUBLICATIONS

Beyler et al. "Thermal Decomposition of Polymers" SFPE Handbook of Fire Protection Engineering 2, Section 1, Chapter 7, pp. 111-131 (2002).

*Primary Examiner* — Fernando L Toledo
*Assistant Examiner* — Neil R Prasad
(74) *Attorney, Agent, or Firm* — Myers Bigel, P.A.

(57) ABSTRACT

Described herein is an integrated circuit device comprising a conductive line structure including a bit line and an insulating capping pattern; and an insulating spacer covering a side wall of the conductive line structure, the insulating spacer including an inner spacer and a char spacer. To form the insulating spacer, a polymer brush pattern may be chemically bonded to the inner spacer to cover a side wall of the conductive line structure; a first insulating spacer film covering the inner spacer and the polymer brush pattern may be formed; and a char spacer may be formed from the polymer brush pattern by pyrolyzing the polymer brush pattern in the absence of oxygen.

20 Claims, 28 Drawing Sheets

(51) Int. Cl.
  *H01L 21/308*    (2006.01)
  *H01L 21/027*    (2006.01)
  *H01L 21/02*     (2006.01)
  *H01L 21/3105*   (2006.01)

(52) U.S. Cl.
  CPC ...... *H01L 21/3081* (2013.01); *H01L 21/3105* (2013.01); *H01L 21/31144* (2013.01)

(56) References Cited

U.S. PATENT DOCUMENTS

| | | |
|---|---|---|
| 8,974,678 B2 | 3/2015 | Millward |
| 2010/0248471 A1 | 9/2010 | Nam et al. |
| 2013/0020719 A1 | 1/2013 | Jung et al. |
| 2014/0061736 A1 | 3/2014 | Hwang et al. |
| 2014/0110816 A1* | 4/2014 | Kim .................. H01L 27/10855 257/499 |
| 2014/0306351 A1* | 10/2014 | Kim ...................... H01L 21/764 257/774 |
| 2015/0099344 A1* | 4/2015 | Kim .................. H01L 27/10891 438/424 |
| 2015/0364334 A1* | 12/2015 | Kang ................ H01L 21/32139 438/703 |

FOREIGN PATENT DOCUMENTS

| | | |
|---|---|---|
| KR | 10-2015-0063650 | 6/2015 |
| KR | 10-2015-0143169 | 12/2015 |

\* cited by examiner

INTEGRATED CIRCUIT DEVICES AND METHODS OF MANUFACTURING THE SAME

CROSS-REFERENCE TO RELATED APPLICATIONS

This application is a continuation application of U.S. patent application Ser. No. 16/005,850, filed Jun. 12, 2018, which claims the benefit of and priority to Korean Patent Application No. 10-2017-0136600, filed on Oct. 20, 2017, in the Korean Intellectual Property Office, the disclosure of which is incorporated herein by reference in its entirety.

FIELD

The inventive concepts relate to an integrated circuit device and a method of manufacturing the same, and more particularly to an integrated circuit device including a plurality of adjacent conductive patterns and a method of manufacturing the integrated circuit device.

BACKGROUND

With the development of electronic technology, semiconductor devices have been rapidly down-scaled. In highly down-scaled semiconductor devices, a distance between a plurality of wiring lines and a plurality of contact plugs between the wiring lines is decreased, leading to an increase in load capacitance between adjacent conductive patterns, so that an operating speed or refresh characteristics are adversely affected. Therefore, techniques for obtaining a structure to solve such problems and a method of realizing the structure are desired.

SUMMARY

The inventive concepts provide an integrated circuit device having a structure for minimizing load capacitance between a plurality of conductive patterns in a cell miniaturized due to high integration density.

The inventive concepts also provide a method of manufacturing an integrated circuit device having a structure for minimizing load capacitance between a plurality of conductive patterns in a cell miniaturized due to high integration density.

According to an aspect of the inventive concepts, there is provided an integrated circuit device including a conductive line structure including a conductive line extending on a substrate in a first horizontal direction and an insulating capping pattern covering the conductive line; and an insulating spacer including an inner spacer contacting a side wall of the conductive line structure and a char spacer on the inner spacer, the char spacer facing the conductive line.

According to another aspect of the inventive concepts, there is provided an integrated circuit device including a pair of conductive line structures of which each includes a conductive line extending on a substrate in a first horizontal direction and an insulating capping pattern covering the conductive line; a plurality of contact structures in a line between the pair of conductive line structures; and a plurality of insulating spacers between the pair of conductive line structures and the plurality of contact structures. Each of the insulating spacers of the plurality of insulating spacers may include an inner spacer contacting a side wall of one of the conductive line structures of the plurality of conductive line structures and a char spacer placed on the inner spacer to face the conductive line.

According to a further aspect of the inventive concept, there is provided a method of manufacturing an integrated circuit device. In the method, a conductive line structure including a conductive line and an insulating capping pattern covering the conductive line is formed on a substrate. An inner spacer covering a side wall of the conductive line structure is formed. A polymer brush pattern chemically bonded to the inner spacer to cover a side wall of the conductive line is formed. A first insulating spacer film is formed on the side wall of the conductive line structure to cover the inner spacer and the polymer brush pattern. A char spacer is formed from the polymer brush pattern by pyrolyzing the polymer brush pattern in the absence of oxygen.

According to another aspect of the inventive concepts, there is provided an integrated circuit device including a conductive line structure comprising a bit line extending on a substrate in a first horizontal direction and an insulating capping pattern on a surface of the bit line opposing the substrate; and an insulating spacer extending in the first horizontal direction and contacting a sidewall of the conductive line structure; the insulating spacer comprising an inner spacer, a char spacer, and a first insulating spacer, wherein the char spacer is enclosed by the inner spacer and the first insulating spacer.

BRIEF DESCRIPTION OF THE DRAWINGS

Embodiments of the inventive concepts will be more clearly understood from the following detailed description taken in conjunction with the accompanying drawings.

DETAILED DESCRIPTION OF THE EMBODIMENTS

Figure 1:
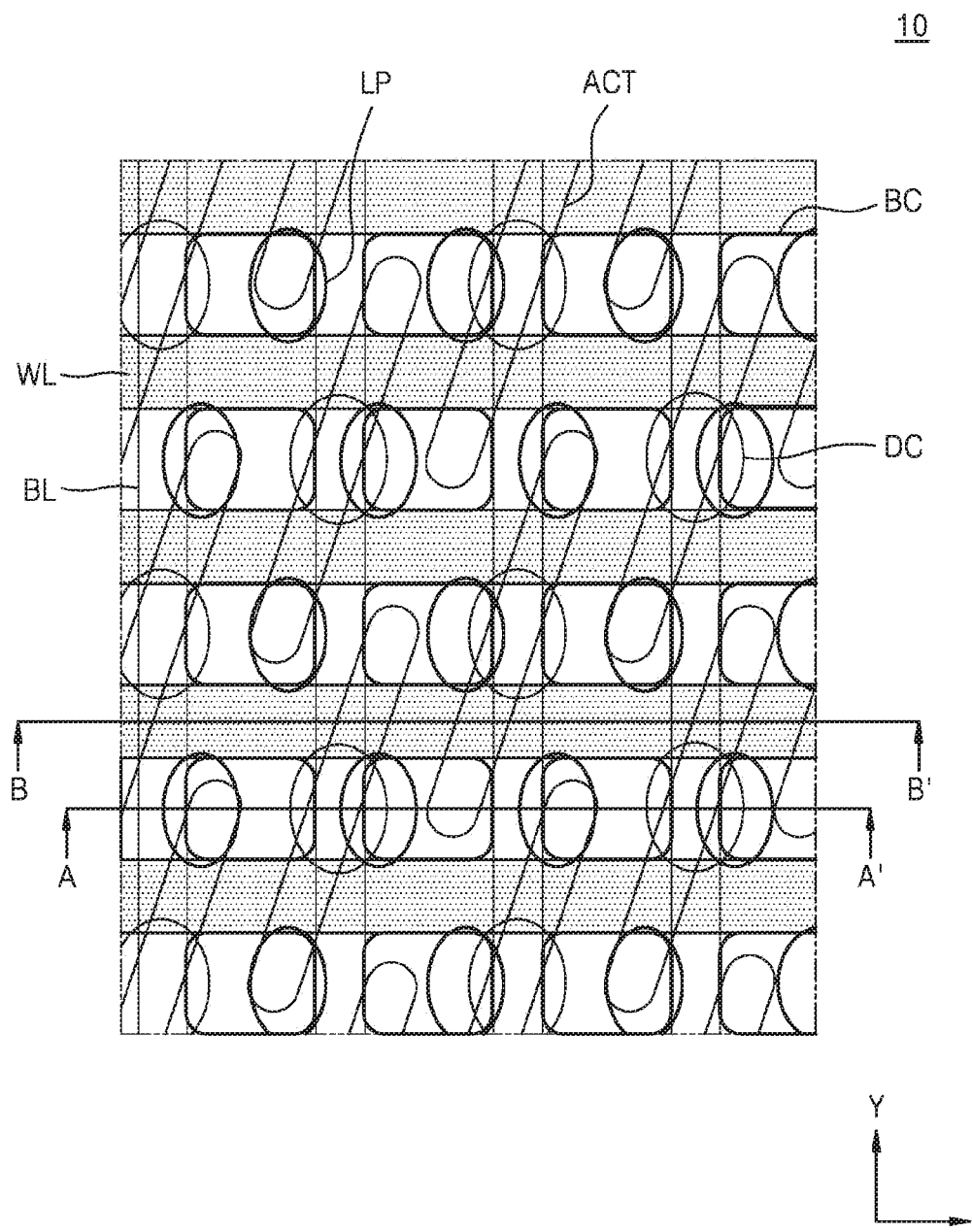
FIG. 1 is a schematic plane layout diagram for explaining main elements in a memory cell array area of an integrated circuit device according to an embodiment of the inventive concepts.

FIG. 1 is a schematic plane layout diagram for explaining main elements in a memory cell array area of an integrated circuit device 10, according to an embodiment of the inventive concepts.

Referring to FIG. 1, a plurality of active regions ACT may extend in a diagonal direction to an X-direction and a Y-direction on a plane of the integrated circuit device 10 and the plurality of active regions ACT may be parallel with one another in the integrated circuit device 10. A plurality of word lines WL may be parallel with one another and each may extend in the X-direction and cross the active regions ACT. A plurality of bit lines BL may be parallel with one another and each may extend over the word lines WL in the Y-direction and cross the X-direction. The bit lines BL may be connected to the active regions ACT through a direct contact DC.

A plurality of buried contacts BC may be formed between two adjacent bit lines of the plurality of bit lines BL. A plurality of conductive landing pads LP may be respectively formed on buried contacts BC of the plurality of buried contacts BC. The buried contacts BC and the conductive landing pads LP may connect a lower electrode (not shown) of a capacitor formed on the bit lines BL to an active region ACT. Each conductive landing pad LP may be placed such that it at least partially overlaps a buried contact BC.

Figure 2A:
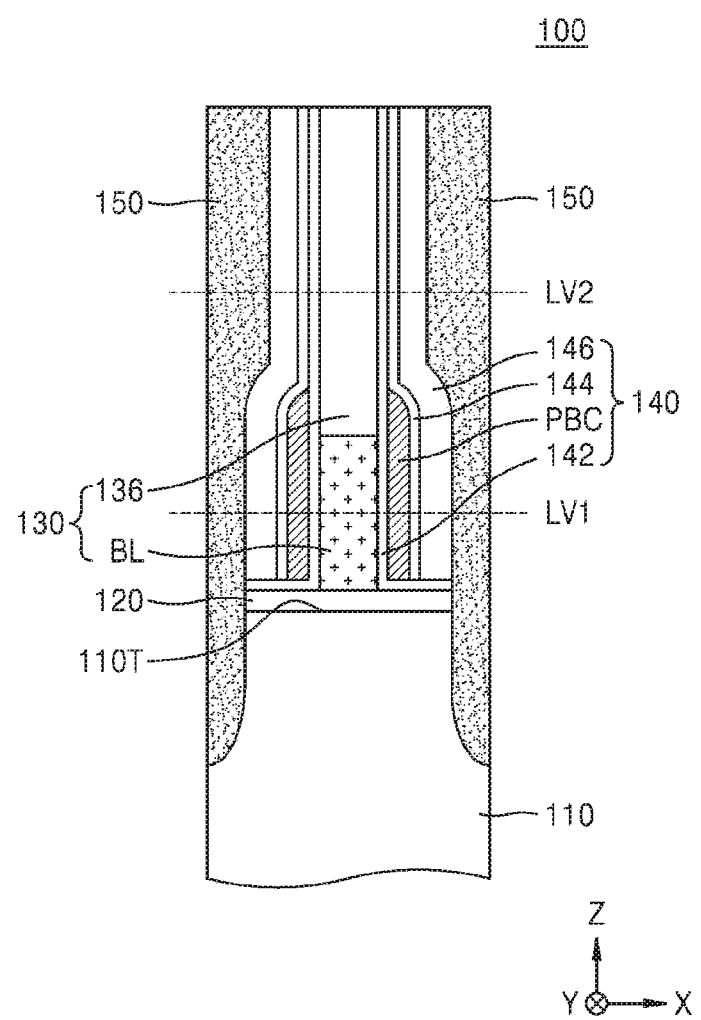
FIG. 2A is a cross-sectional view of a main portion of an integrated circuit device according to an embodiment of the inventive concepts.
Figure 2B:
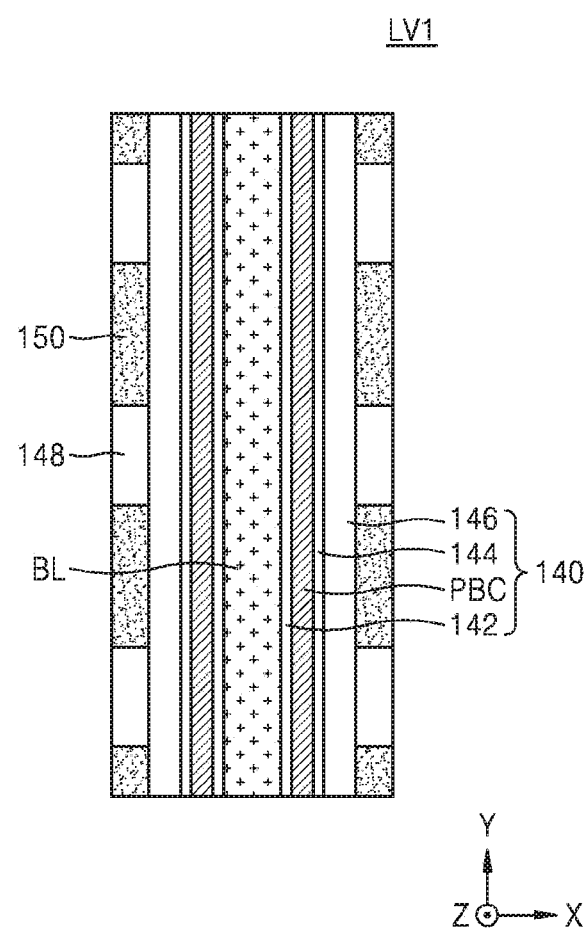
FIGS. 2B and 2C are plan views of partial areas of the integrated circuit device shown in FIG. 2A.
Figure 2C:
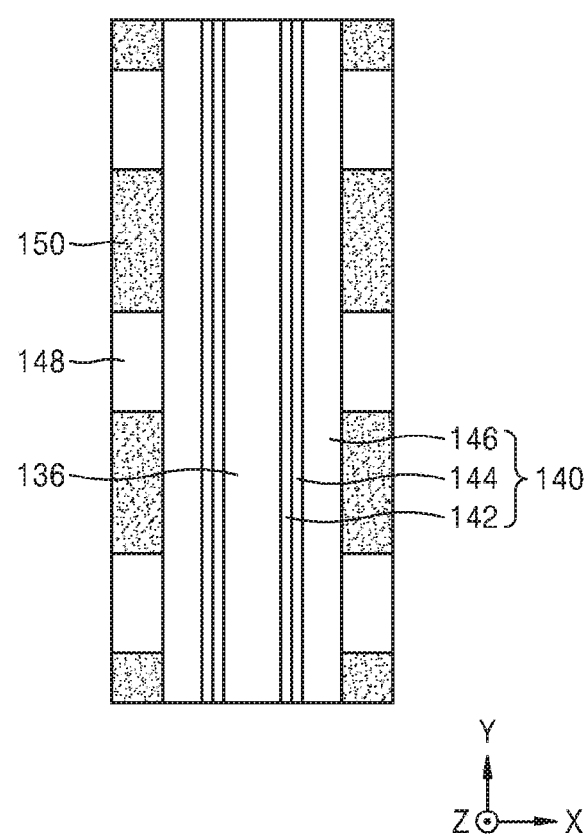

FIG. 2A is a cross-sectional view of a main portion of an integrated circuit device 100, according to an embodiment of the inventive concepts. FIG. 2B is a plan view of a partial area of the integrated circuit device 100 at a first level LV1 shown in FIG. 2A. FIG. 2C is a plan view of a partial area of the integrated circuit device 100 at a second level LV2 shown in FIG. 2A. The integrated circuit device 100 shown in FIGS. 2A through 2C may be part of the integrated circuit device 10 shown in FIG. 1.

Referring to FIGS. 2A through 2C, the integrated circuit device 100 includes a conductive line structure 130 including a bit line BL extending in a first horizontal direction, i.e., the Y-direction, on a substrate 110 and an insulating capping pattern 136 covering the bit line BL.

In some embodiments, the substrate 110 may include silicon, e.g., monocrystalline silicon, polysilicon, or amorphous silicon. In other embodiments, the substrate 110 may include at least one selected from Ge, SiGe, SiC, GaAs, InAs, and InP. The substrate 110 may include a conductive region, e.g., an impurity-doped well or an impurity-doped structure.

An insulating film 120 is formed on the substrate 110. The insulating film 120 may include a silicon oxide film, a silicon nitride film, or a combination thereof.

The conductive line structure 130 may extend in the Y-direction on the insulating film 120. The bit line BL may be formed of conductive polysilicon, TiN, TiSiN, W, tungsten silicide, or a combination thereof. The insulating capping pattern 136 may be formed of a silicon nitride film.

A plurality of contact structures 150 may be placed in a line in the Y-direction at each of opposite sides of the conductive line structure 130. An insulating fence 148 may be placed between adjacent contact structures 150 at each side of the conductive line structure 130 as shown in FIGS. 2B and 2C. Each contact structure 150 may extend through the insulating film 120 to a level lower than a top surface 110T of the substrate 110. Each contact structure 150 may be formed of doped polysilicon, metal, conductive metal nitride, metal silicide, or a combination thereof. The insulating fence 148 may be formed of a silicon nitride film.

Each of opposite side walls of the conductive line structure 130 is covered with an insulating spacer 140. The bit line BL may be insulated from a plurality of the contact structures 150 by the insulating spacer 140. The insulating spacer 140 may extend in the Y-direction to be alongside the bit line BL on the substrate 110.

The insulating spacer 140 may include an inner spacer 142 contacting a side wall of the conductive line structure 130 and a char spacer PBC, a first insulating spacer 144, and a second insulating spacer 146 which are sequentially placed on the inner spacer 142 to cover the side wall of the conductive line structure 130.

The height of the top surface of the char spacer PBC may be greater than (e.g., extend above) that of the top surface of the bit line BL and less than that of the top surface of the insulating capping pattern 136. The char spacer PBC may be placed to face the bit line BL at a level, e.g., the first level LV1, between the substrate 110 and the top surface of the bit line BL. A lower side wall of the insulating capping pattern 136 adjacent to the bit line BL may be covered with the char spacer PBC. An upper side wall of the insulating capping pattern 136 spaced apart from the bit line BL, e.g., a side wall of the insulating capping pattern 136 at the second level LV2, may not be covered with the char spacer PBC. The char spacer PBC may have a thickness of about 2 nm to about 5 nm.

The char spacer PBC may include a hydrocarbon polymer char. In some embodiments, the char spacer PBC may be formed of a vinyl polymer char. For example, the char spacer PBC may be formed of a char of an aromatic hydrocarbon polymer, a (meth)acrylic polymer, a vinylpyridine polymer, a vinylester polymer, a vinylpyrrolidone polymer, an olefin polymer, a copolymer thereof, and a combination thereof. Polymers used to form the char spacer PBC will be described in detail with reference to FIGS. 11A and 11B below.

The char spacer PBC may include various hydrocarbon compounds and/or solid carbides such as, e.g., those produced when a carbon ring of a hydrocarbon polymer is broken by pyrolysis.

In some embodiments, the char spacer PBC may include about 70 to about 90 weight percent of carbon and about 10 to about 30 weight percent of hydrogen, based on the total weight of the char spacer PBC, but the inventive concepts are not limited thereto. For example, the char spacer PBC may have various carbon contents such as, e.g., about 72 to about 88 weight percent and about 75 to about 85 weight percent, based on the total weight of the char spacer PBC. In another example, the char spacer PBC may include about 60 to about 90 weight percent of carbon and about 10 to about 40 weight percent of hydrogen, based on the total weight of the char spacer PBC. In a further example, the char spacer PBC may include about 80 to about 95 weight percent of carbon and about 5 to about 20 weight percent of hydrogen, based on the total weight of the char spacer PBC.

In some embodiments, the char spacer PBC may also include at least one additional component selected from halogens, nitrogen (N), oxygen (O), sulfur (S), phosphorous (P), sodium (Na), magnesium (Mg), manganese (Mn), silicon (Si), iron (Fe), and combinations thereof. The additional component may be derived from a polymer used to form the char spacer PBC. The additional component may be included in an amount of about 0 to about 10 weight percent based on the total weight of the char spacer PBC. In some embodiments, the char spacer PBC may include a solid material layer produced from pyrolysis of a polymer. The solid material layer may have a porous structure.

The inner spacer 142 may extend to conformally cover the side wall of the conductive line structure 130 and the top surface of the insulating film 120. In some embodiments, the inner spacer 142 may be formed of a silicon nitride film.

The first insulating spacer 144 may cover the side wall of the conductive line structure 130 and be spaced apart from the conductive line structure 130. The first insulating spacer 144 may contact the inner spacer 142 and the char spacer PBC. In particular, an outer wall of the char spacer PBC and the top surface thereof may contact the first insulating spacer 144. The outer wall of the char spacer PBC is at an opposite side of the bit line BL. The first insulating spacer 144 may contact the inner spacer 142 at an upper side wall of the insulating capping pattern 136 not covered with the char spacer PBC. The first insulating spacer 144 may have a step portion between a portion contacting the inner spacer 142 and a portion contacting the char spacer PBC, the step portion contacting a top surface of the char spacer PBC. In some embodiments, the first insulating spacer 144 may be formed of a silicon oxide film.

The second insulating spacer 146 may cover a side wall of the bit line BL with the inner spacer 142, the char spacer PBC, and the first insulating spacer 144 between the second insulating spacer 146 and the bit line BL. The second insulating spacer 146 may cover the char spacer PBC such that the first insulating spacer 144 is between the second insulating spacer 146 and the char spacer PBC. The second insulating spacer 146 may contact an outer side wall of the first insulating spacer 144. The second insulating spacer 146 may be formed of a different material than the first insulating spacer 144. In some embodiments, the second insulating spacer 146 may be formed of a silicon nitride film or a SiCN film. The SiCN film is formed of Si, carbon (C), and N.

Permittivity of the char spacer PBC may be lower than that of any one of the inner spacer 142, the first insulating spacer 144, and the second insulating spacer 146. In some embodiments, the permittivity of the char spacer PBC may be about 1.1 to about 3.5, but is not limited thereto. In some embodiments, the permittivity of the char spacer PBC may be about 1.1 to about 2 or about 1.1 to about 1.5, but is not limited thereto.

Figure 3:
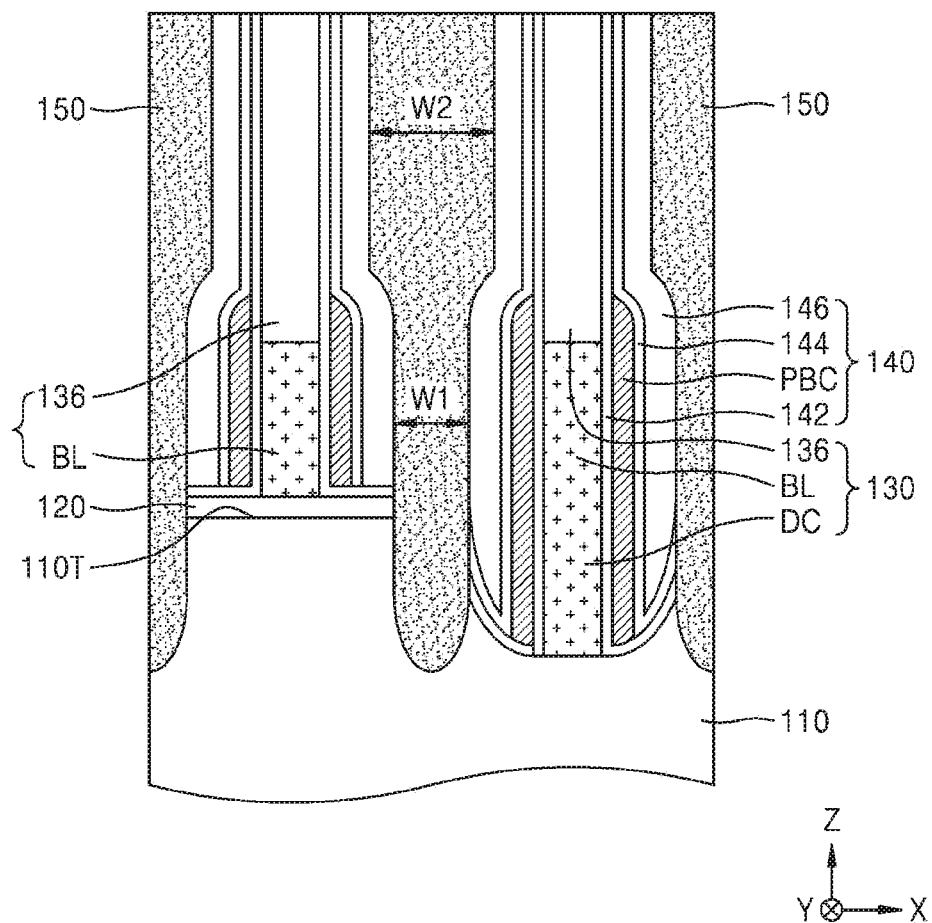
FIG. 3 is a cross-sectional view of a main portion of an integrated circuit device according to another embodiment of the inventive concepts.

FIG. 3 is a cross-sectional view of a main portion of an integrated circuit device 200, according to some embodiments of the inventive concepts. The integrated circuit device 200 shown in FIG. 3 may be part of the integrated circuit device 10 shown in FIG. 1. In FIGS. 2A through 3, like reference numerals denote like elements, and thus descriptions thereof will be omitted.

The integrated circuit device 200 includes a plurality of conductive line structures 130 of which each includes a bit line BL extending in the first horizontal direction, i.e., the Y-direction, on the substrate 110 and the insulating capping pattern 136 covering the bit line BL. The conductive line structures 130 may be substantially the same as the conductive line structure 130 described with reference to FIGS. 2A through 2C. However, each conductive line structure 130 shown in FIG. 3 may also include a direct contact DC connected between the bit line BL and an active region of the substrate 110. In some embodiments, the bit line BL and the direct contact DC may be integrally connected.

The integrated circuit device 200 may include a plurality of insulating spacers 140 respectively covering opposite sides of each conductive line structure 130. The insulating spacers 140 may have substantially the same structure as the insulating spacer 140 described with reference to FIGS. 2A through 2C. However, a portion of each of the insulating spacers 140, e.g., a portion covering the direct contact DC, may extend toward the inside of the substrate 110 down to a level lower than a top surface 110T of the substrate 110. Accordingly, an inner spacer 142, a char spacer PBC, a first insulating spacer 144, and a second insulating spacer 146 at each side of the direct contact DC may each extend toward the inside of the substrate 110 down to a level lower than a top surface 110T of the substrate 110.

A plurality of contact structures 150 may placed between two adjacent conductive line structures 130 in a line in the Y-direction and an insulating fence 148 may be placed between two adjacent contact structures 150, as described above with reference to FIGS. 2A through 2C. In a contact structure 150 between two adjacent conductive line structures 13Q, a portion facing the char spacer PBC may have a first width W1 in a second horizontal direction, i.e., an X-direction, and a portion facing the insulating capping pattern 136 at a level higher than the top surface of the char spacer PBC may have a second width W2, the second width W2 being greater than the first width W1 in the X-direction.

Although exemplary structures of an integrated circuit device have been described according to some embodiments of the inventive concepts, the inventive concepts are not limited to these embodiments. According to the inventive concepts, integrated circuit devices having structures including modifications and/or changes made in the embodiments described with reference to FIGS. 1 through 3 without departing from the spirit and scope of the inventive concepts may be provided.

The integrated circuit devices 100 and 200 include the insulating spacer 140, which includes the char spacer PBC having very low permittivity, between the conductive line structure 130 and a plurality of contact structures 150. Accordingly, a structure for minimizing load capacitance between a plurality of conductive patterns in a cell miniaturized due to high integration density may be provided according to some embodiments of the inventive concepts.

FIGS. 4 through 18 are cross-sectional views of the stages in a method of manufacturing an integrated circuit device 400, according to an embodiment of the inventive concepts. Sections (a) in FIGS. 4 through 9, FIGS. 10A through 16A, and FIGS. 17 and 18, respectively, show cross-sectional views of the stages in the method, taken along the line A-A' shown in FIG. 1, and sections (b) therein show cross-sectional views of the stages in the method, taken along the line B-B' shown in FIG. 1. FIGS. 10B, 11B, 12B, 13B, 14B, 15B, and 16B are enlarged cross-sectional views of portions EX shown in FIGS. 10A, 11A, 12A, 13A, 14A, 15A, and 16A, respectively. In FIGS. 1 through 18, like reference numerals denote like elements, and thus descriptions thereof will be omitted.

Figure 4:
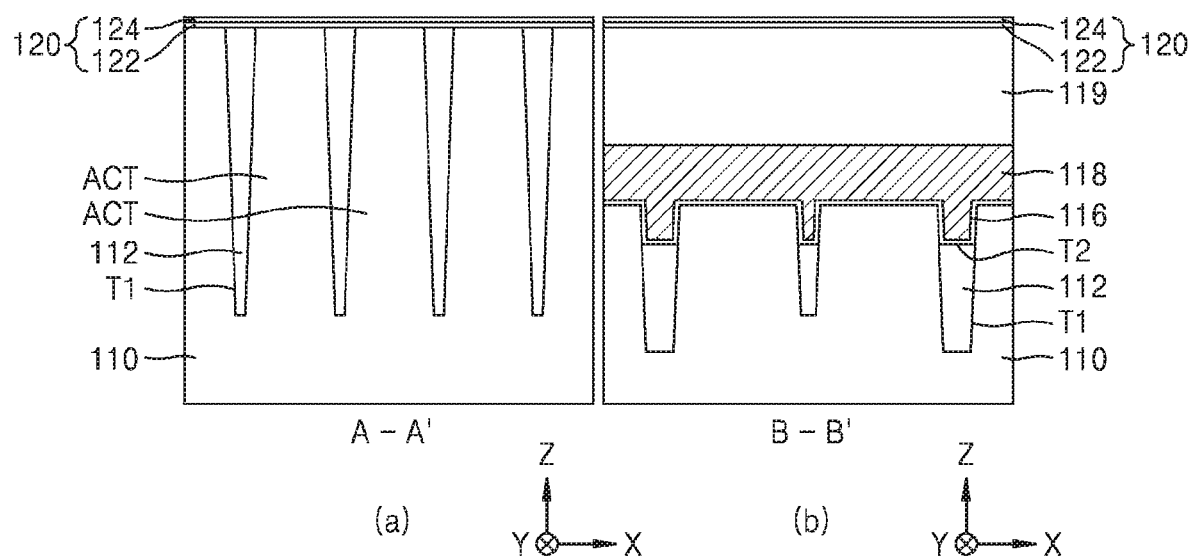
FIGS. 4 through 18 are cross-sectional views of the stages in a method of manufacturing an integrated circuit device according to an embodiment of the inventive concepts.

Referring to FIG. 4, an isolation trench T1 is formed in the substrate 110, and an isolation film 112 is formed in the isolation trench T1.

An active region ACT may be defined in the substrate 110 by the isolation film 112. The isolation film 112 may include an oxide film, a nitride film, or a combination thereof. The isolation film 112 may have a single-layer structure formed of one kind of an insulating film, a dual-layer structure formed of two different kinds of insulating films, or a multi-layer structure formed of a combination of at least three different kinds of insulating films.

A plurality of word line trenches T2 may be formed in the substrate 110. The word line trenches T2 extend in parallel with one another in the X-direction and may have a line shape crossing the active region ACT. As shown in section (b) in FIG. 4, to form the word line trenches T2 having a step at bottoms thereof, the isolation film 112 and the substrate 110 may be etched using separate etching processes, which may provide the etched depth of the isolation film 112 to be different than that of the substrate 110. After the resultant structure having the word line trenches T2 is cleaned, a gate dielectric film 116, a word line 118, and a burying insulating film 119 may be sequentially formed in each of the word line trenches T2. The word line 118 may form each of the word lines WL shown in FIG. 1. In some embodiments, after a plurality of word lines 118 are formed, impurity ions may be implanted into the substrate 110 at opposite sides of each word line 118 to form a plurality of source/drain regions on the top surfaces of a plurality of active regions ACT. In other embodiments, ion-implantation for forming a plurality of source/drain regions may be performed before a plurality of word lines 118 are formed.

The gate dielectric film 116 may include at least one selected from a silicon oxide film, a silicon nitride film, a silicon oxynitride film, an oxide/nitride/oxide (ONO) film, and a high dielectric film having a higher dielectric constant than a silicon oxide film. For example, the gate dielectric film 116 may have a dielectric constant of about 10 to about 25. In some embodiments, the gate dielectric film 116 may be formed of $HfO_2$, $Al_2O_3$, $HfAlO_3$, $Ta_2O_3$, $TiO_2$, or a combination thereof, but the inventive concepts are not limited thereto. The word lines 118 may be formed of Ti, TiN, Ta, TaN, W, WN, TiSiN, WSiN, or a combination thereof.

The top surface of each of a plurality of burying insulating films 119 may be substantially at the same level as a top surface of the substrate 110. The burying insulating films 119 may include a silicon oxide film, a silicon nitride film, a silicon oxynitride film, or a combination thereof. The insulating film 120 is formed on the burying insulating films 119 and the substrate 110. The insulating film 120 may include a first insulating film 122 and a second insulating film 124, which are sequentially formed on the substrate 110. The insulating film 120 may be formed to cover the top surfaces of the active regions ACT, the top surface of the isolation film 112, and the top surfaces of the burying insulating films 119. In some embodiments, the first insulating film 122 may include a silicon oxide film and the second insulating film 124 may include a silicon nitride film.

Figure 5:
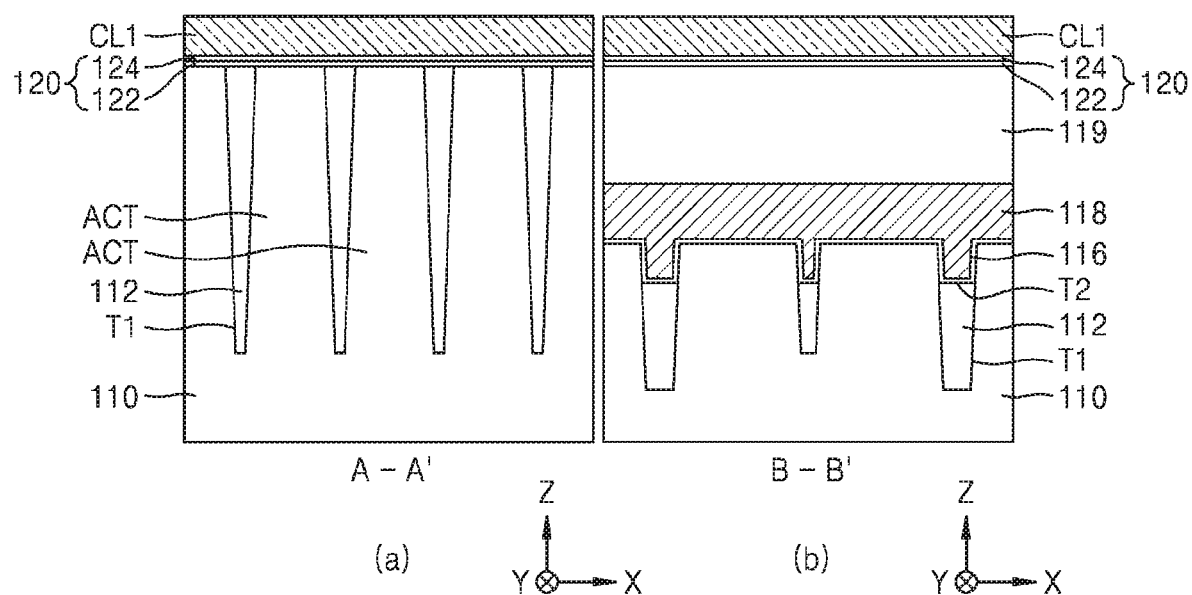

Referring to FIG. 5, a first conductive layer CL1 is formed on the insulating film 120. The first conductive layer CL1 may be formed of a doped polysilicon.

Figure 6:
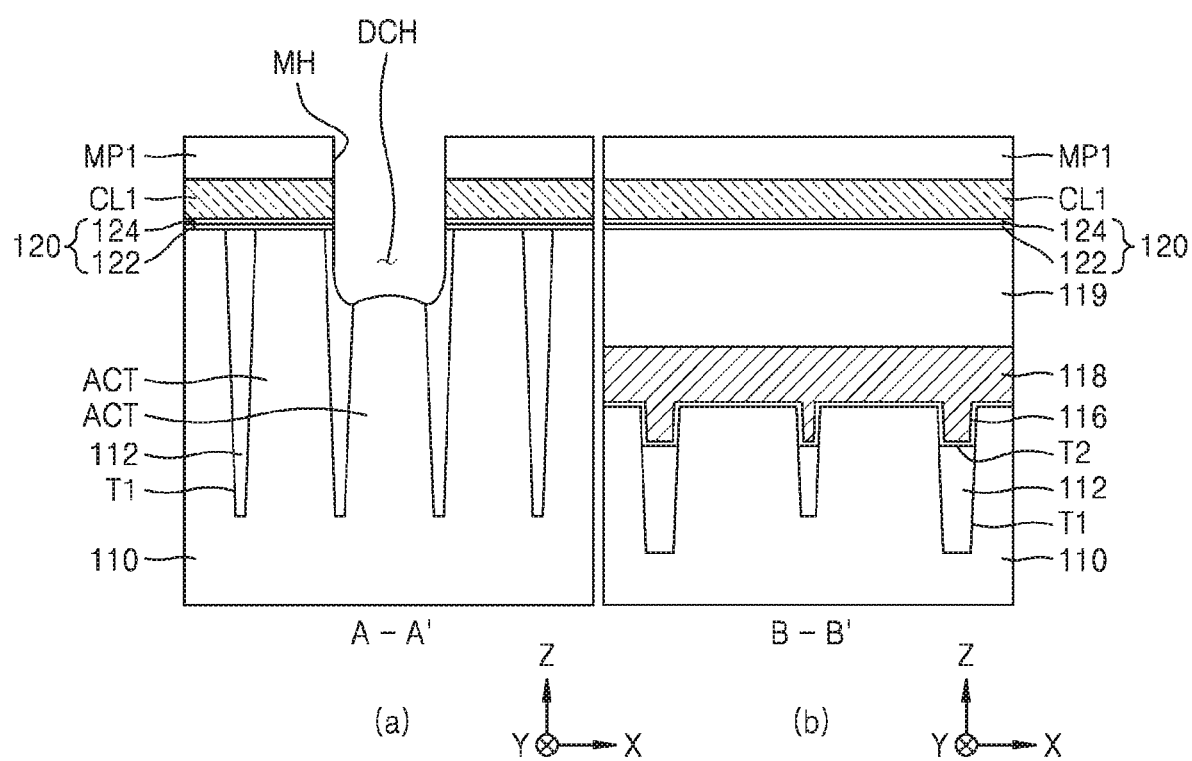

Referring to FIG. 6, after a mask pattern MP1 is formed on the first conductive layer CL1, the first conductive layer CL1 may be exposed through an opening MH of the mask pattern MP1 after it is etched. A portion of the substrate 110 and a portion of the isolation film 112 are exposed as the result of the etching and etched, so that a direct contact hole DCH exposing an active region ACT of the substrate 110 is formed.

The mask pattern MP1 may be formed of an oxide film, a nitride film, or a combination thereof. Photolithography may be used to form the mask pattern MP1.

Figure 7:
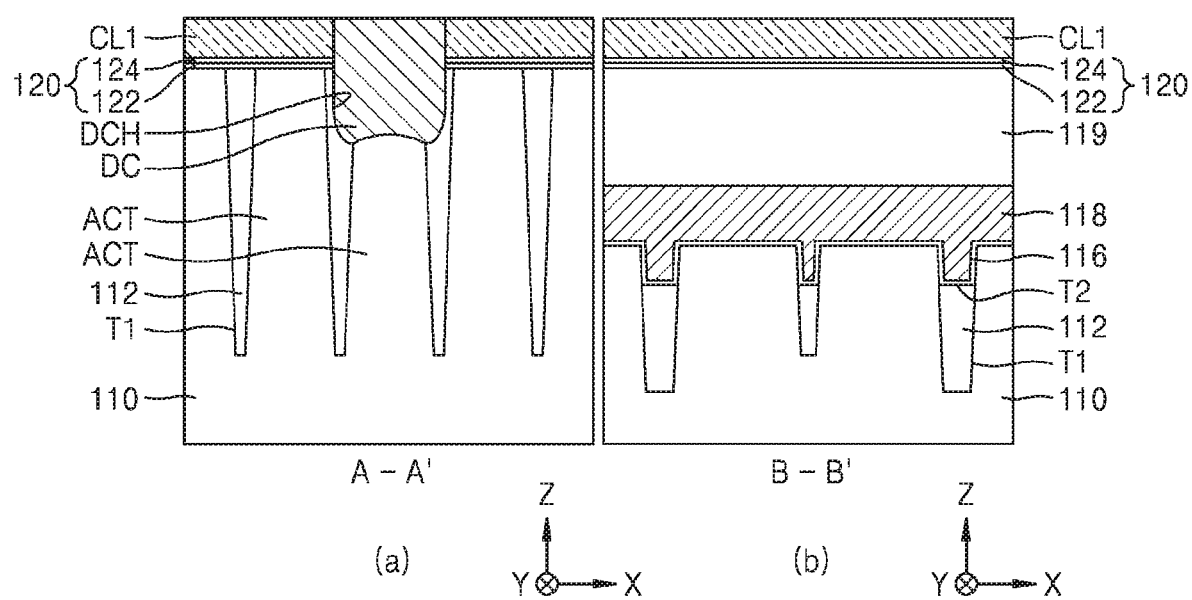

Referring to FIG. 7, the mask pattern MP1 (see FIG. 6) is removed, and the direct contact DC is formed in the direct contact hole DCH.

In an exemplary process of forming the direct contact DC, a second conductive layer may be formed in the direct contact hole DCH and on the first conductive layer CL1 to a thickness sufficient to fill the direct contact hole DCH and then etched back such that the second conductive layer remains only within the direct contact hole DCH. The second conductive layer may be formed of a doped polysilicon, but the inventive concepts are not limited thereto.

Figure 8:
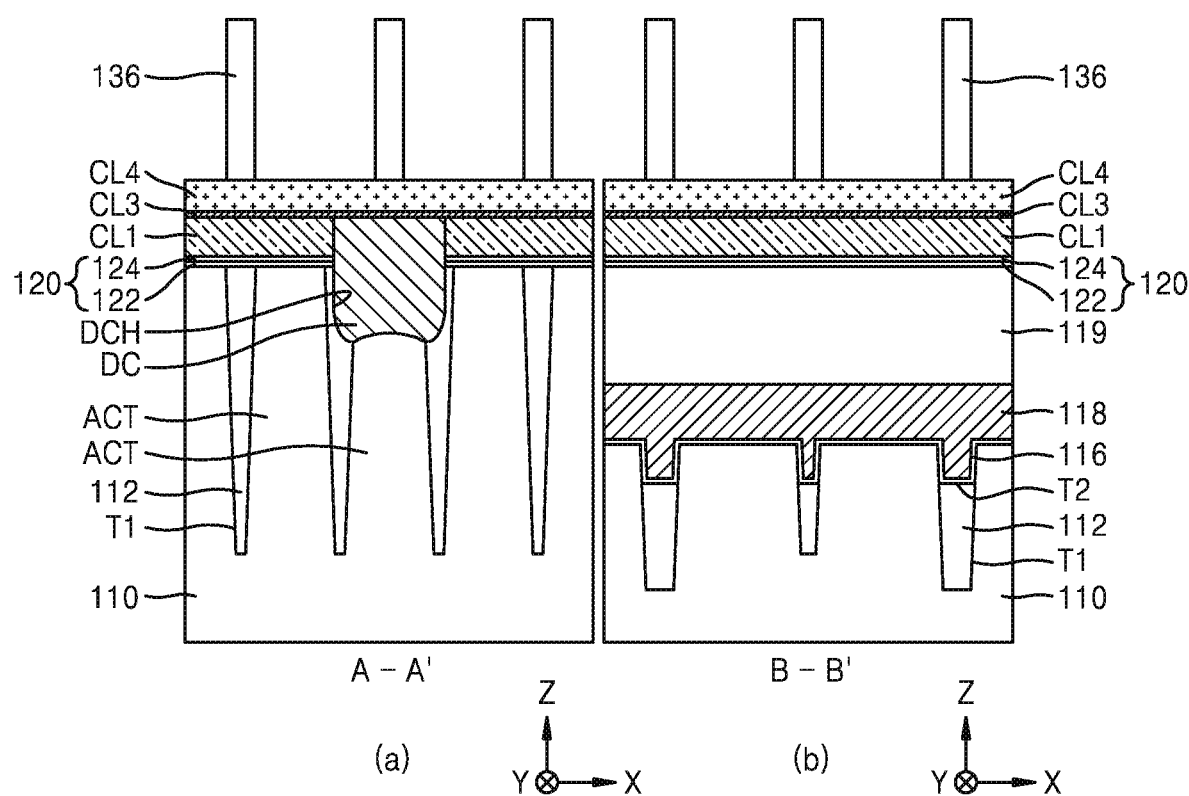

Referring to FIG. 8, a third conductive layer CL3, a fourth conductive layer CL4, and a plurality of insulating capping patterns 136 are sequentially formed on the first conductive layer CL1 and the direct contact DC.

Each of the insulating capping patterns 136 may be formed in line pattern extending in the Y-direction. The third conductive layer CL3 and the fourth conductive layer CL4 may be formed of TiN, TiSiN, W, tungsten silicide, or a combination thereof. In some embodiments, the third conductive layer CL3 may include TiSiN and the fourth conductive layer CL4 may include W. The insulating capping patterns 136 may be formed of a silicon nitride film.

Figure 9:
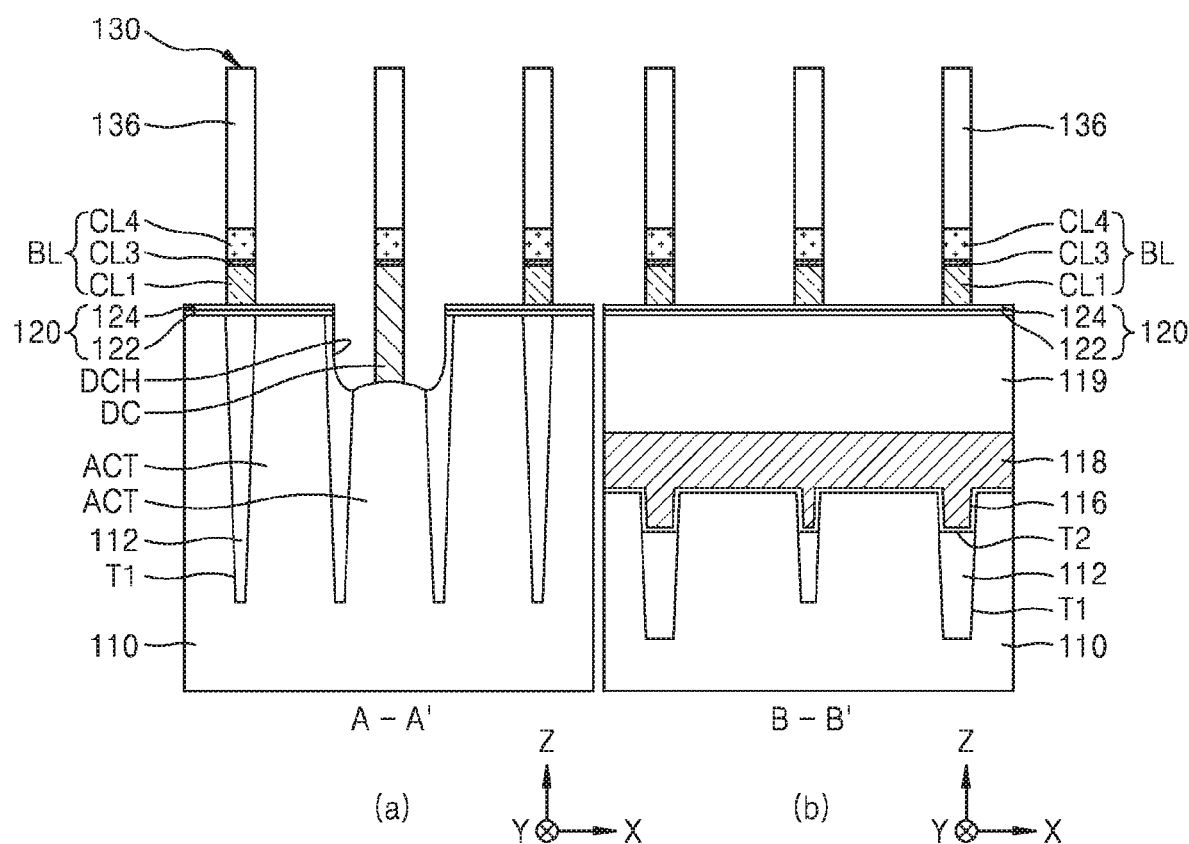

Referring to FIG. 9, the fourth conductive layer CL4, the third conductive layer CL3, the first conductive layer CL1, and the direct contact DC below the insulating capping patterns 136 are partially etched using the insulating capping patterns 136 as etch masks to form a plurality of bit lines BL on the substrate 110. As a result, a plurality of conductive line structures 130 each including a bit line BL and an insulating capping pattern 136 may be formed. The conductive line structures 130 may include the direct contact DC integrally connected to the bit line BL.

Each of the bit lines BL may be formed of remaining portions of the first conductive layer CL1, the third conductive layer CL3, and the fourth conductive layer CL4, respectively. After the bit lines BL are formed, a portion of the direct contact hole DCH around the direct contact DC may be re-exposed.

Figure 10A:
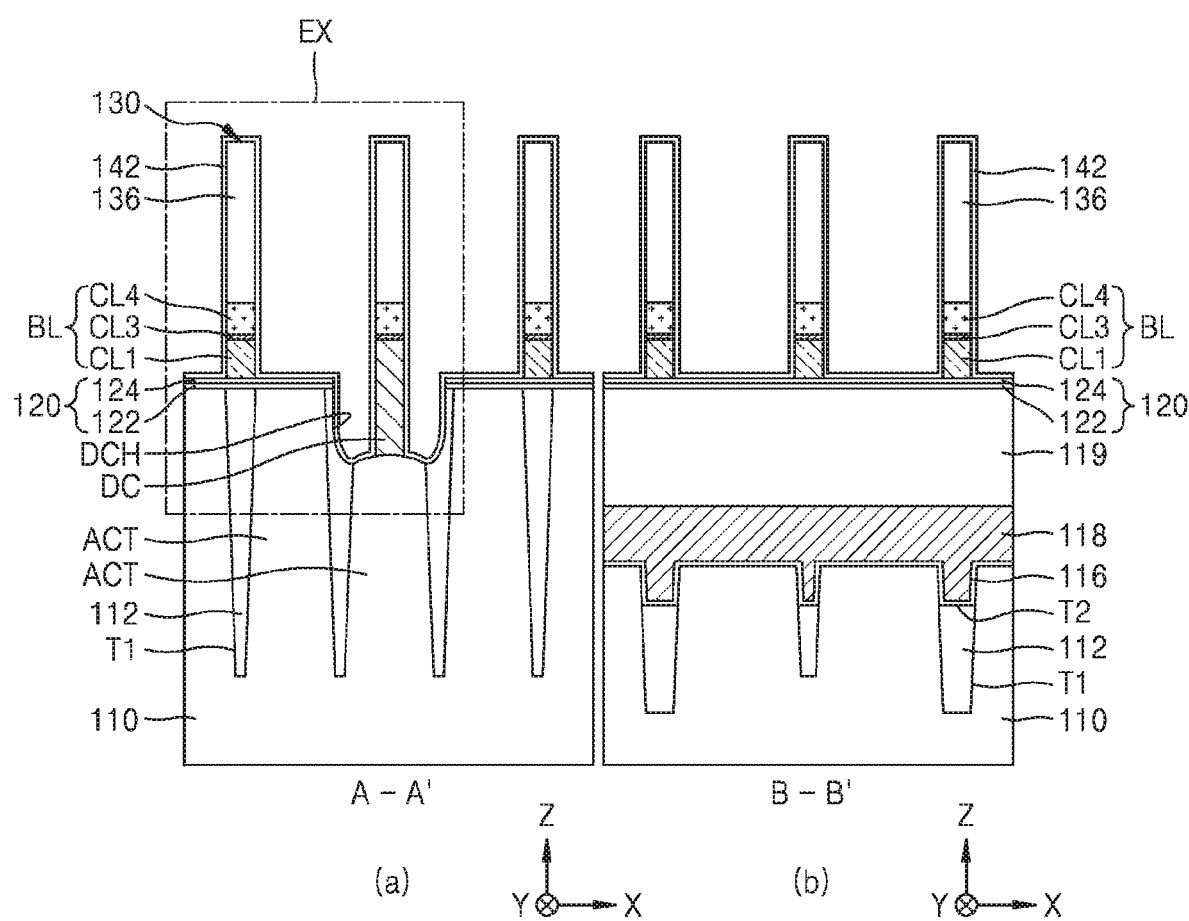
Figure 10B:
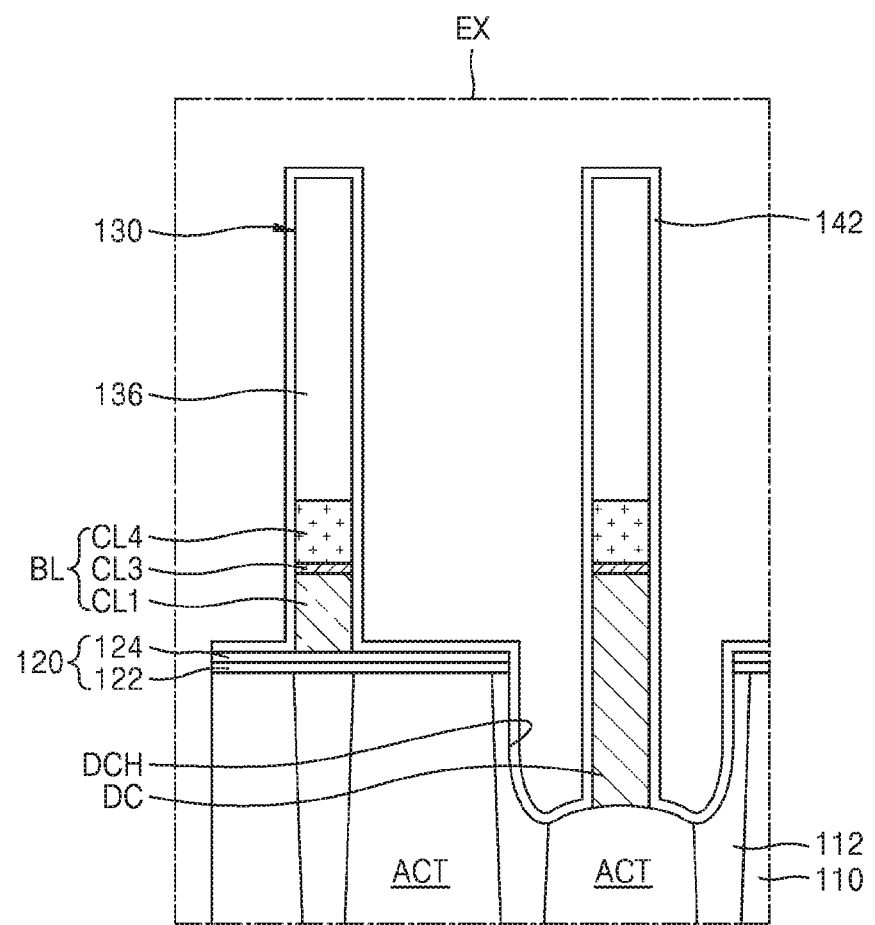

Referring to FIGS. 10A and 10B, an inner spacer 142 is formed to conformally cover the exposed surface of the resultant structure shown in FIG. 9.

In some embodiments, atomic layer deposition (ALD) and/or chemical vapor deposition (CVD) may be used to form the inner spacer 142.

Figure 11A:
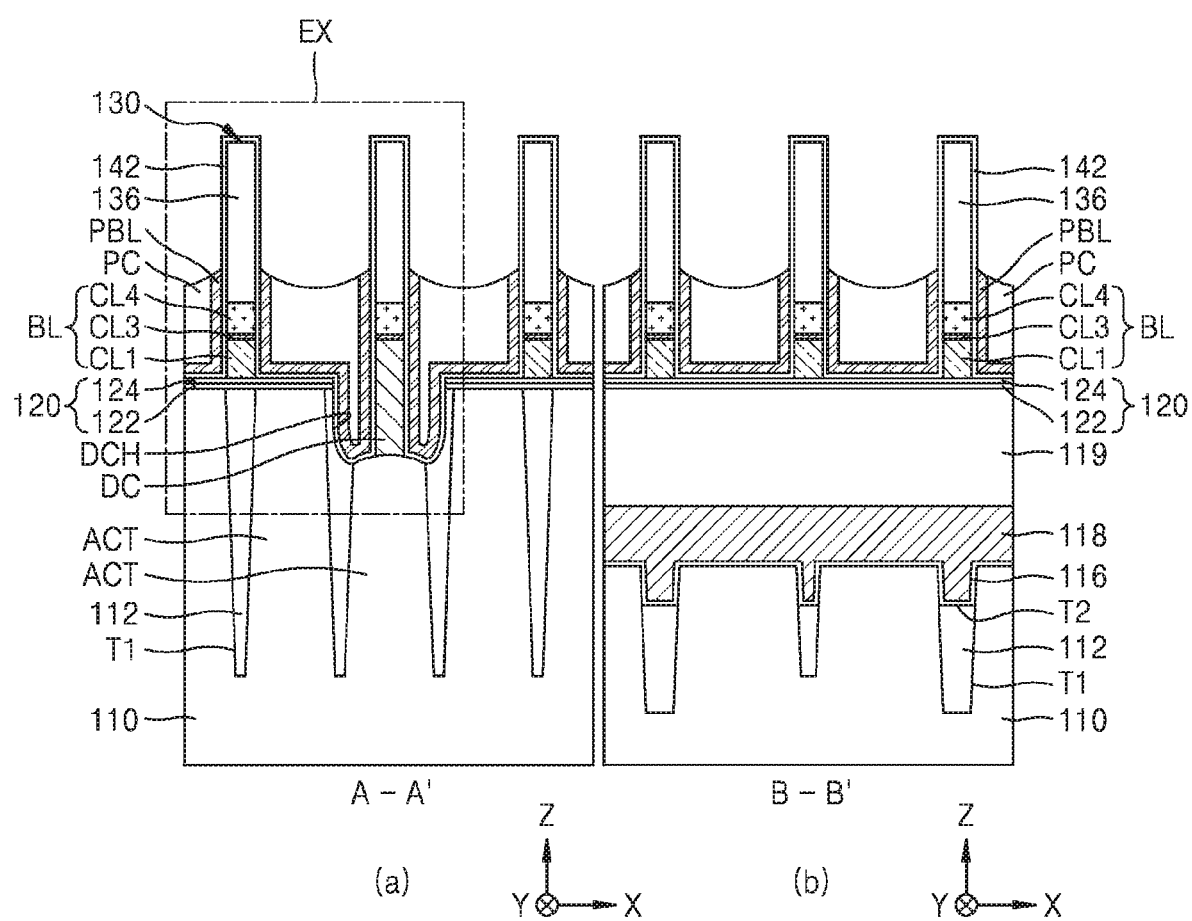
Figure 11B:
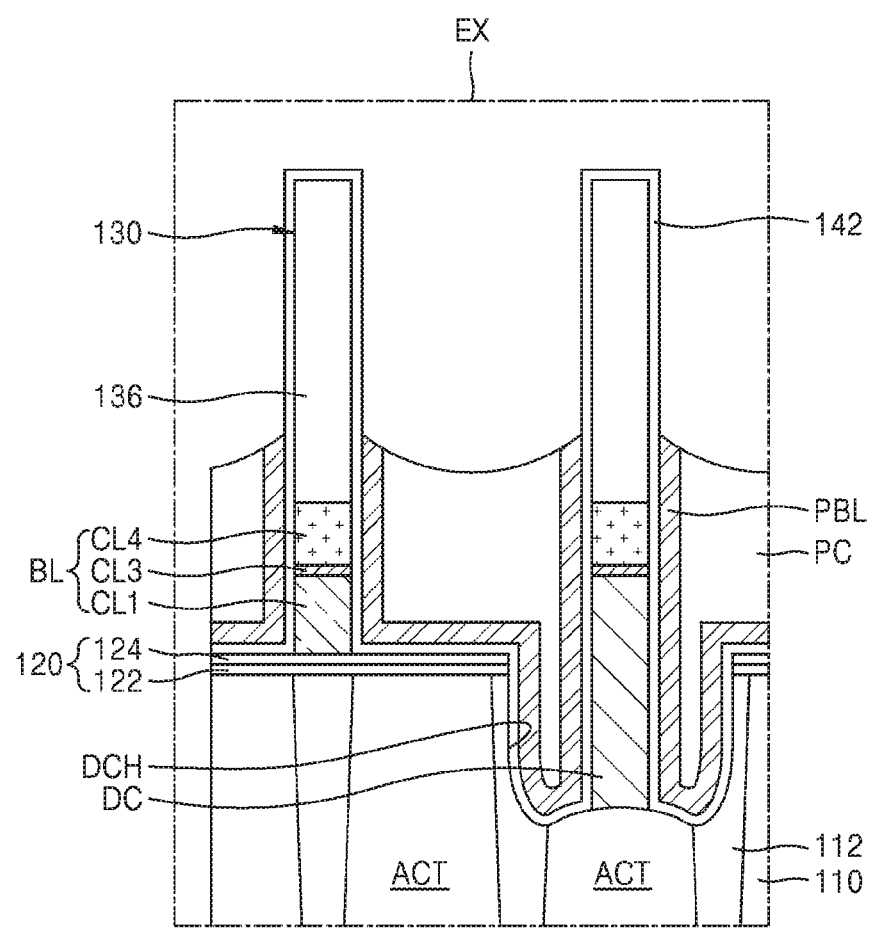

Referring to FIGS. 11A and 11B, after the resultant structure having the inner spacer 142 shown in FIG. 10A is cleaned, a polymer brush layer PBL is formed on the inner spacer 142 to cover a side wall of each of the conductive line structures 130.

The polymer brush layer PBL may be formed to conformally cover an exposed surface in a space between two adjacent conductive line structures 130 and to have a top surface lower than the top surface of the conductive line structures 130.

In some embodiments, the following processes may be performed to form the polymer brush layer PBL. First, a polymer composite including a fixing polymer having an anchoring group may be coated on the resultant structure having the inner spacer 142 to form a polymer composite layer PC.

In some embodiments, the polymer composite layer PC may include and/or may be formed to include only fixing polymers having the same or similar molecular weights. For example, all fixing polymers included in the polymer composite layer PC may have a number average molecular weight (Mn) in a range of about 2,000 to about 500,000, and may have a polydispersity (i.e., the ratio of the weight average molecular weight (Mw)/the number average molecular weight (Mn) of the fixing polymers included in the polymer composite layer PC) of at most about 1.1, but the inventive concepts are not limited thereto. In some embodiments, the polymer composite layer PC comprises fixing polymers having a polydispersity of less than about 1.1.

The polymer composite layer PC may be formed to have a top surface lower than the top surface of the conductive line structures 130. The polymer composite layer PC may have a concave top surface due to surface tension. The concave top surface may be highest at an edge contacting the inner spacer 142 and may have a slope declining away from the edge and toward the middle of the polymer composite layer PC.

The polymer composite layer PC may be thermally processed to induce a reaction between the anchoring group of the fixing polymers and the exposed surface of the inner spacer 142 so that the fixing polymers are grafted onto the surfaces of the inner spacer 142 contacting the polymer composite layer PC. As a result, the polymer brush layer PBL may be formed on the inner spacer 142. In some embodiments, the fixing polymers may be grafted onto the surfaces of the inner spacer 142 due to a condensation reaction between a hydroxyl group, i.e., an anchoring group of the fixing polymers, and a hydroxyl group remaining on the surface of the inner spacer 142 after the inner spacer 142 is cleaned. The thermal processing for forming the polymer brush layer PBL may be performed at a temperature of about 150 to about 300° C. for about 60 to about 300 seconds, but the inventive concepts are not limited thereto.

In some embodiments, the polymer brush layer PBL may be formed to a thickness of about 2 to about 5 nm, but the inventive concepts are not limited thereto.

A fixing polymer included in the polymer composite layer PC may be formed of a vinyl polymer derived from C2-C30 vinyl monomers. For example, the fixing polymer may be formed of an aromatic hydrocarbon polymer, a (meth)acrylic polymer, a vinylpyridine polymer, a vinylester polymer, a vinylpyrrolidone polymer, an olefin polymer, a copolymer thereof, or a combination thereof. When the fixing polymer is formed of a copolymer, the copolymer may be a block copolymer or a random copolymer.

The aromatic hydrocarbon polymer may include a monomer unit derived from styrene monomers such as, e.g., styrene, o-methylstyrene, m-methylstyrene, and/or p-methylstyrene.

The (meth)acrylic polymer may include a monomer unit derived from, e.g., alkyl(meth)acrylate monomers, hydroxyalkyl(meth)acrylate monomers, oxyalkyl(meth)acrylate monomers, aminoalkyl(meth)acrylate monomers, fluorinated monofunctional (meth)acrylate monomers, and/or (meth)acrylamide monomers. The alkyl groups of these monomers may be C1-C10 alkyl groups.

The vinylpyridine polymer may include a monomer unit derived from vinylpyridine monomers such as, e.g., 2-vinylpyridine, 3-vinylpyridine, and/or 4-vinylpyridine.

The vinylester polymer may include, e.g., a monomer unit derived from vinyl acetate. The vinylpyrrolidone polymer may include, e.g., a monomer unit derived from N-vinyl-2-pyrrolidone.

A monomer forming the olefin polymer may include, e.g., a monomer unit derived from olefin monomers such as, e.g., ethylene and/or butadiene.

For example, the fixing polymer may include polystyrene, polydimethylsiloxane, polymethylmethacrylate, polyacrylate, polyvinylacetate, poly(methylmethacrylate-random-trifluoroethylmethacrylate) (P(MMA-r-TFEMA)), and/or poly(methylmethacrylate-random-dodecafluoroheptylmethacrylate) (P(MMA-r-DFHMA)).

The anchoring group in the fixing polymer included in the polymer composite layer PC may function to fix the fixing polymer to exposed surfaces contacting the polymer composite layer PC on the substrate 110. In some embodiments, the anchoring group may include a substituted or an unsubstituted hydroxyl group, a thiol group, an azide group, a carboxylic acid group, an amide group, an epoxide group, a vinyl group, and/or a trichlorosilane group. For example, the fixing polymer may include a polymer having a hydroxyl terminal such as, e.g., hydroxyl-terminated polystyrene or hydroxyl-terminated polymethylmethacrylate.

Figure 19:
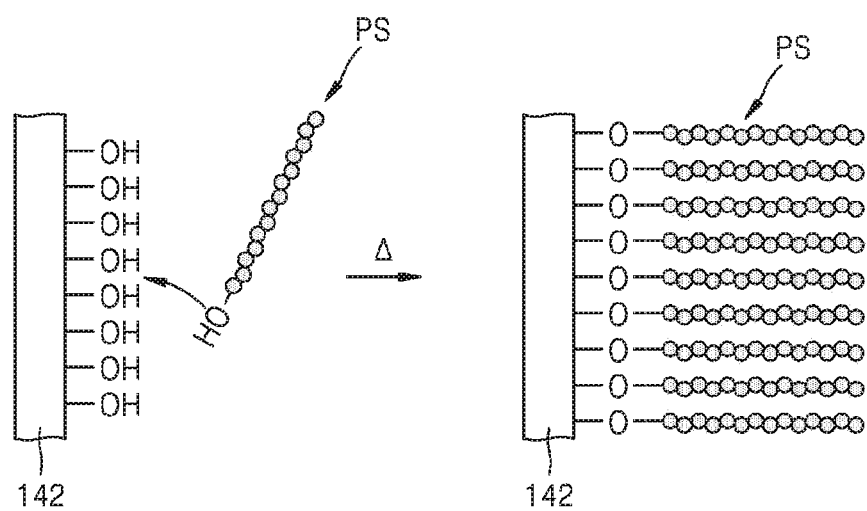
FIG. 19 is a schematic diagram of a procedure for forming a polymer brush layer in a method of manufacturing an integrated circuit device according to an embodiment of the inventive concepts.

FIG. 19 schematically shows a procedure in which a hydroxyl-terminated polystyrene brush is covalently bonded to a surface of the inner spacer 142, which has been cleaned with a solvent, by a grafting-from polymerization when the polymer brush layer PBL shown in FIGS. 11A and 11B is formed using hydroxyl-terminated polystyrene PS as a fixing polymer.

Figure 12A:
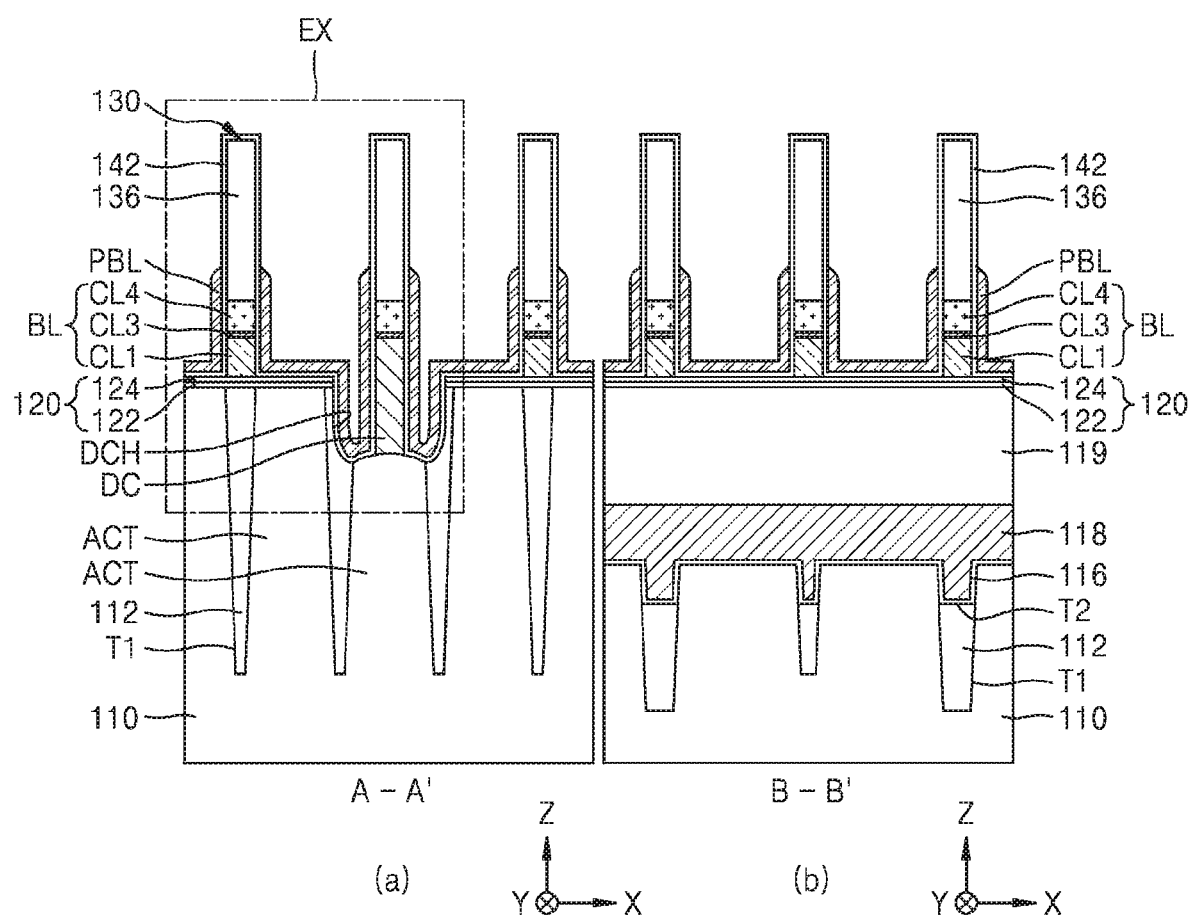
Figure 12B:
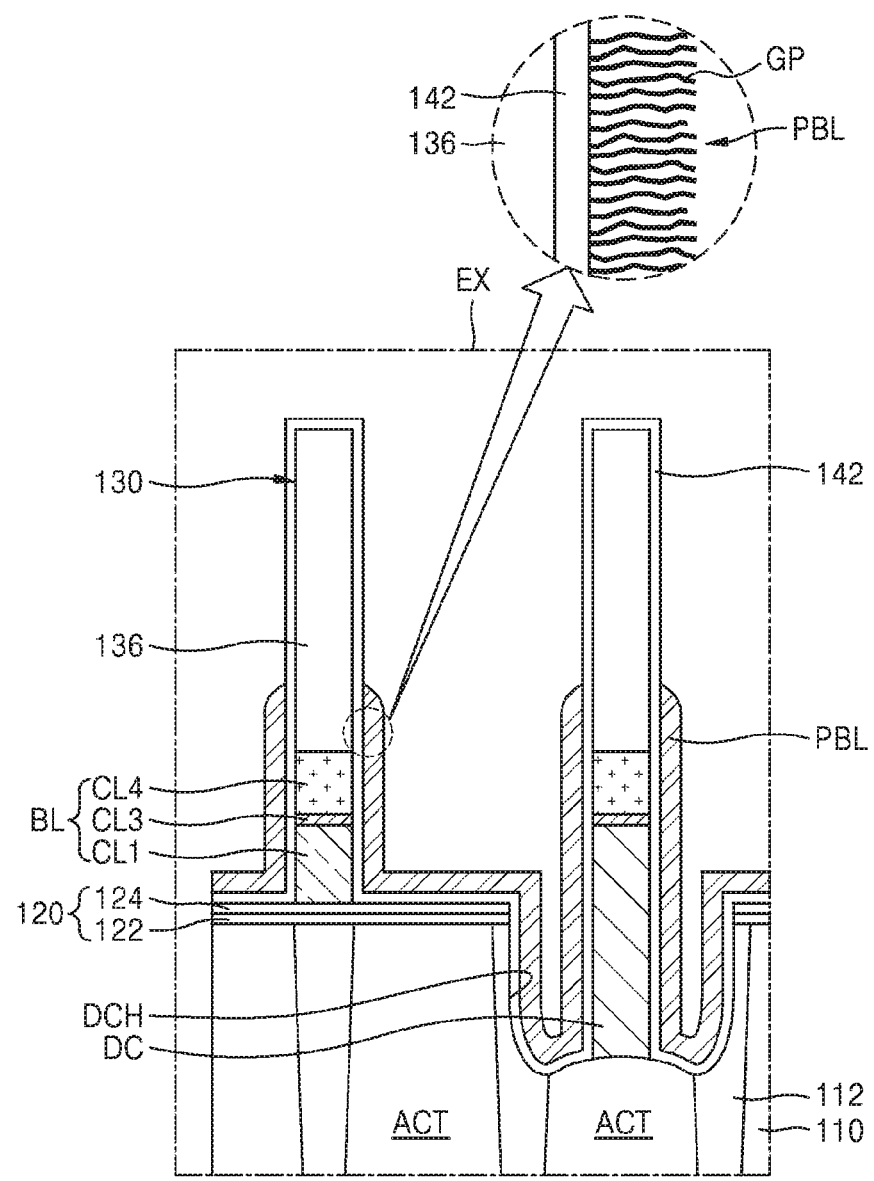

Referring to FIGS. 12A and 12B, an unreacted portion of the polymer composite layer PC is removed from the resultant structure shown in FIG. 11A using an organic solvent to expose an outer wall of the polymer brush layer PBL.

The organic solvent may be propylene glycol monomethyl ester acetate (PGMEA), propylene glycol monomethyl ester (PGME), ethyl-3-ethoxy propionate (EEP), ethyl lactate (EL), methyl 2-hydroxybutyate (HBM), and/or gamma-butyro lactone (GBL) but is not limited thereto.

As shown in FIG. 12B, the polymer brush layer PBL includes a plurality of graft polymers GP bonded to the surface of the inner spacer 142. One end of each of the graft polymers GP may be fixed to the surface of the inner spacer 142 and the other end of each graft polymer GP may be a free end not fixed to any place (e.g., compound or surface). When all fixing polymers included in the polymer composite layer PC shown in FIGS. 11A and 11B have the same or similar molecular weights, the plurality of graft polymers GP bonded to the surface of the inner spacer 142 may have substantially the same length. As a result, the polymer brush layer PBL may have substantially a uniform thickness along the side wall of the inner spacer 142 in a vertical direction. In some embodiments, the thickness of the polymer brush layer PBL may vary by less than about ±10%.

Figure 13A:
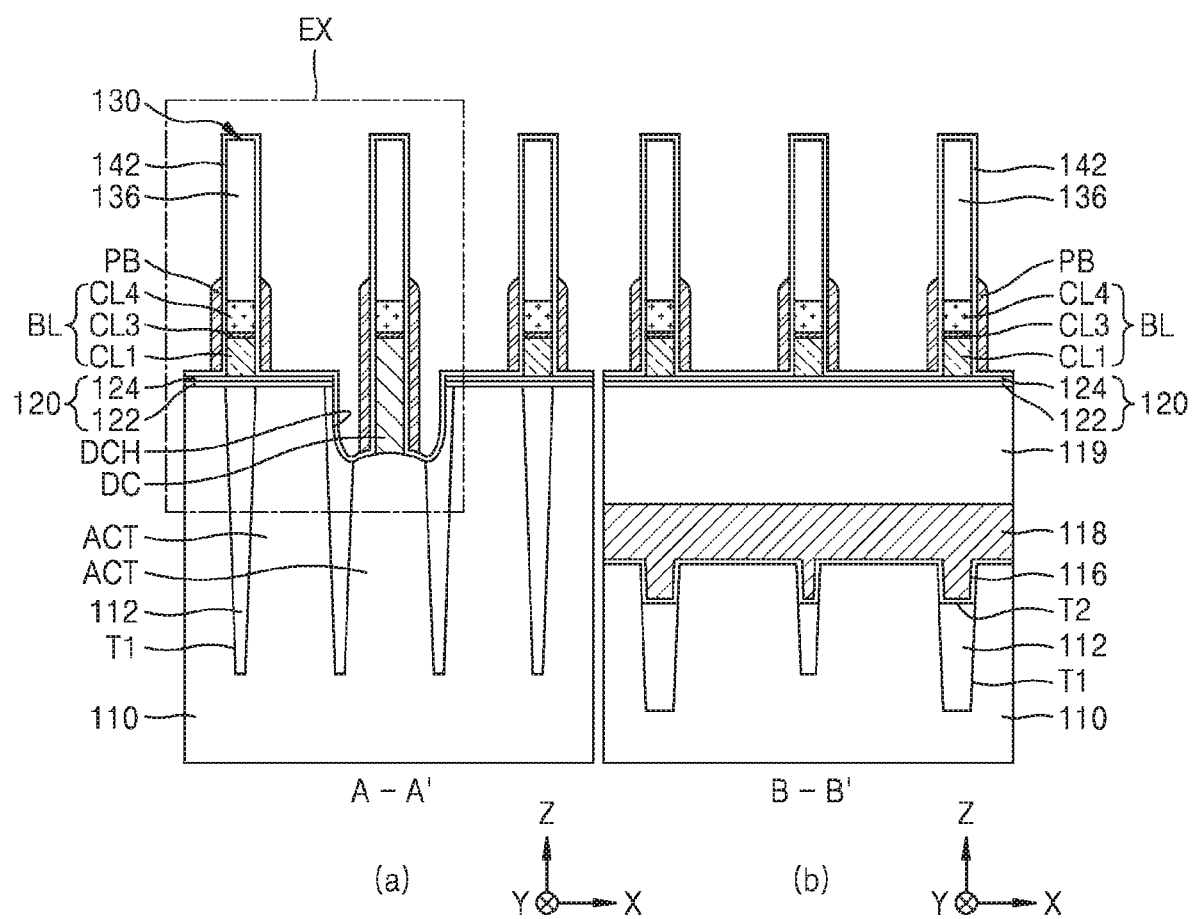
Figure 13B:
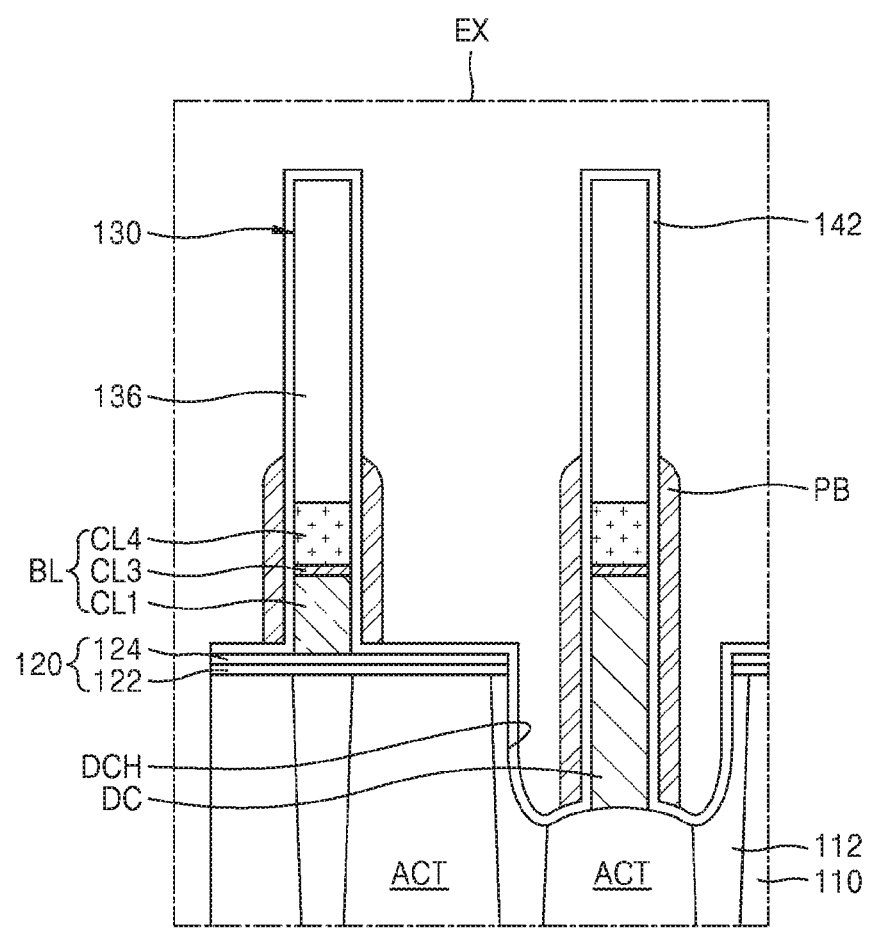

Referring to FIGS. 13A and 13B, the polymer brush layer PBL is etched back so that unnecessary portions of the polymer brush layer PBL apart from portions covering the side walls of the conductive line structures 130 are removed. As a result, a plurality of polymer brush patterns PB formed on the inner spacer 142 to respectively cover a portion of the side walls of the conductive line structures 130 may be obtained. The top surface of the polymer brush patterns PB may be higher than the top surface of the bit lines BL and lower than the top surface of the insulating capping pattern 136. Each of the polymer brush patterns PB may cover a lower side wall of a conductive line structure 130 to face a bit line BL and a direct contact DC. Each polymer brush pattern PB may have a thickness of about 2 to about 5 nm.

Figure 14A:
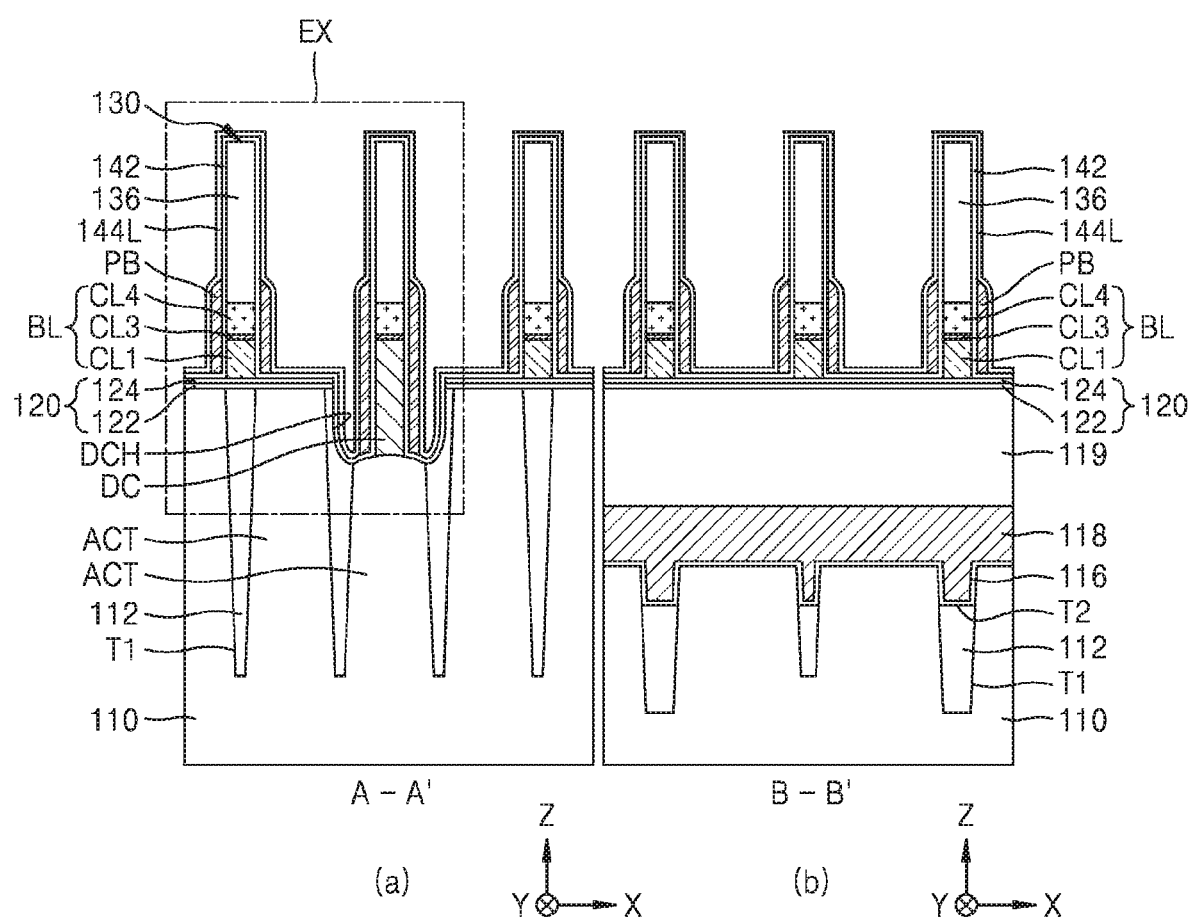
Figure 14B:
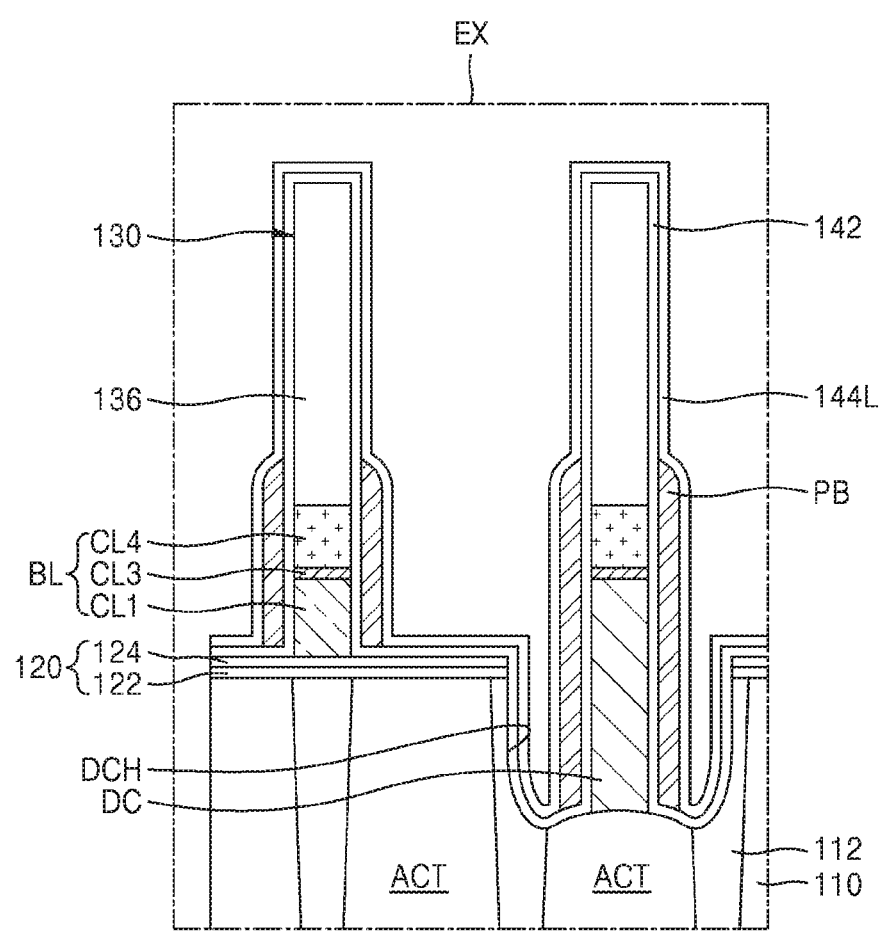

Referring to FIGS. 14A and 14B, a first insulating spacer film 144L is formed on the resultant structure having the polymer brush patterns PB to conformally cover the exposed surfaces of the inner spacer 142 and the exposed surfaces of the polymer brush patterns PB.

In some embodiments, ALD may be performed to form the first insulating spacer film 144L. The first insulating spacer film 144L may include a silicon oxide film.

After the first insulating spacer film 144L is formed, the polymer brush patterns PB may be surrounded and enclosed by the inner spacer 142 and the first insulating spacer film 144L so that the polymer brush patterns PB are not exposed. In some embodiments, a surface of the polymer brush patterns PB is not exposed (e.g., to oxygen and/or air above the first insulating spacer film 144L) after the formation of the first insulating spacer film 144L.

Figure 15A:
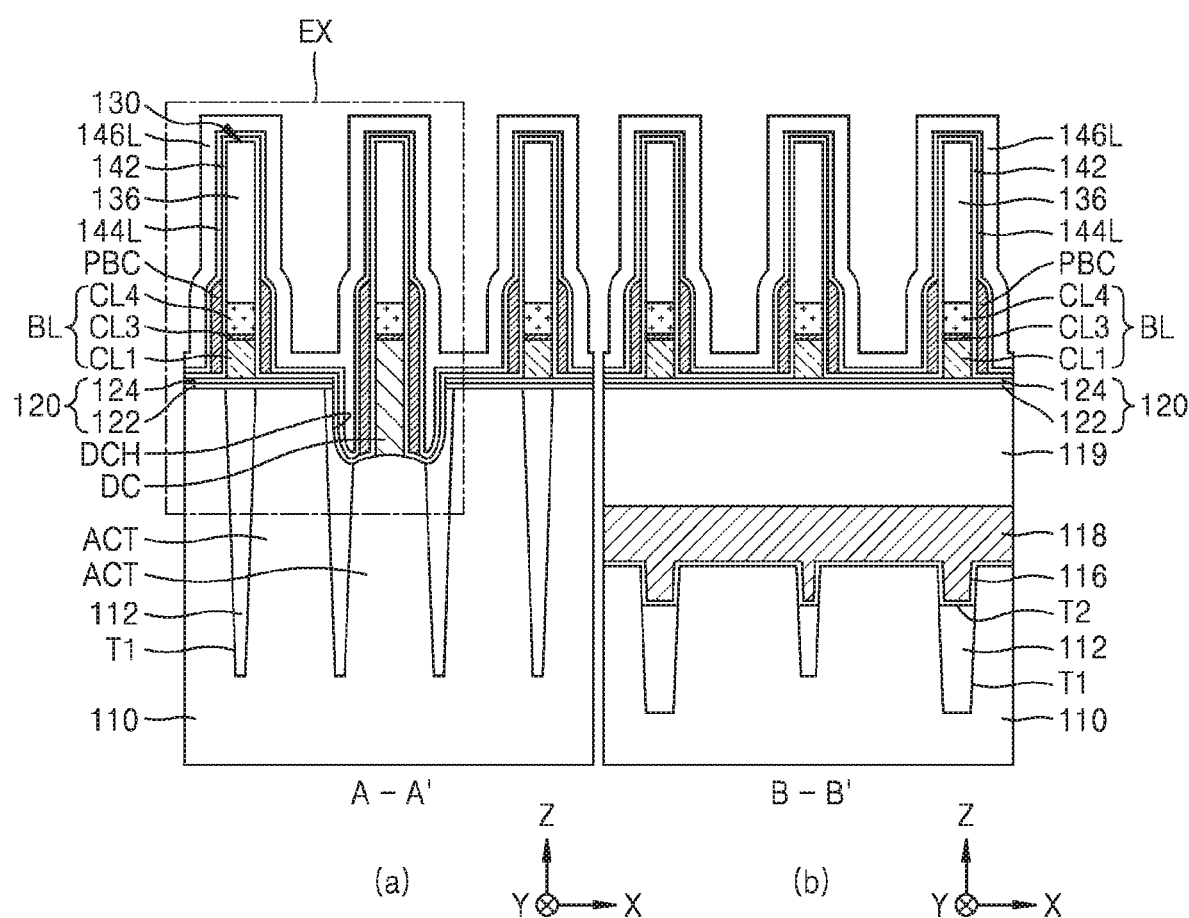
Figure 15B:
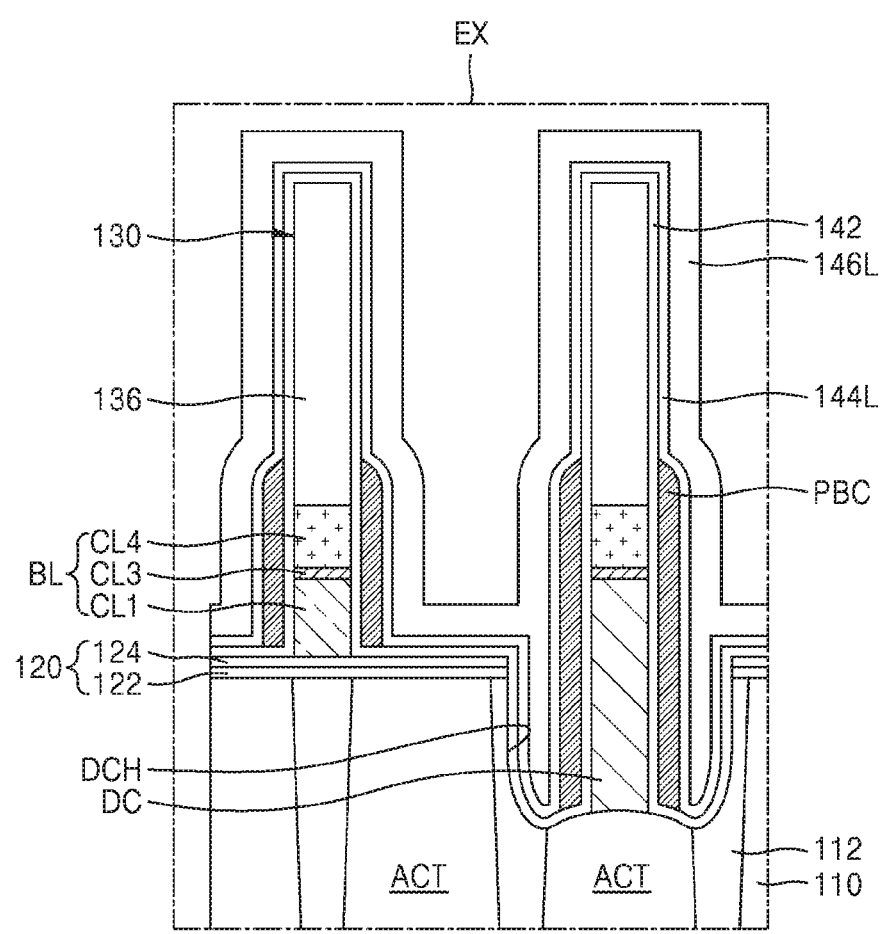

Referring to FIGS. 15A and 15B, a second insulating spacer film 146L is formed on the resultant structure having the first insulating spacer film 144L. While the second insulating spacer film 146L is being formed, the polymer brush patterns PB are pyrolyzed so that a char spacer PBC is formed from each polymer brush pattern PB.

The second insulating spacer film 146L may be formed to conformally cover the first insulating spacer film 144L. The second insulating spacer film 146L may include a silicon nitride film.

To form the char spacer PBC, a plurality of graft polymers GP forming the polymer brush pattern PB may be thermally processed in the absence of oxygen. At this time, thermal processing temperature may be the same or similar to the pyrolysis temperature of the graft polymers GP. For example, deposition for forming the second insulating spacer film 146L may be performed at about 250° C. to about 1,000° C. in the absence of oxygen so that the char spacer PBC is formed from the polymer brush pattern PB. Since the deposition is performed in the absence of oxygen, oxygen atoms may not be included in the second insulating spacer film 146L. In some embodiments, the second insulating spacer film 146L may include a silicon nitride film or a SiCN film. In some embodiments, the second insulating spacer film 146L may be formed using ALD and/or CVD.

For example, when the pyrolysis temperature of the graft polymers GP forming the polymer brush pattern PB is about 350° C. to about 450° C., a process for forming the second insulating spacer film 146L may be performed at a temperature of about 350° C. to about 550° C. for about 1 minute to about 60 minutes, but the inventive concepts are not limited thereto.

While the graft polymers GP forming the polymer brush pattern PB are being thermally processed in the absence of oxygen to form the char spacer PBC, thermal agitation may occur in the graft polymers GP, so that a side chain around a main chain may decompose, breaking the chemical bond of the graft polymers GP. At this time, decomposition of the side chain may be faster than decomposition of the main chain, and a chain structure forming the graft polymers GP may mostly remain as carbon, transforming into char.

In other embodiments, a process of forming the second insulating spacer film 146L and thermal processing of the polymer brush pattern PB may not be performed simultaneously but may be separately performed. For example, after the second insulating spacer film 146L is formed, the polymer brush pattern PB is thermally processed in the absence of oxygen to form the char spacer PBC. Alternatively, after the polymer brush pattern PB covered with the first insulating spacer film 144L may be thermally processed in the absence of oxygen to form the char spacer PBC, the second insulating spacer film 146L may be formed on the first insulating spacer film 144L.

Figure 16A:
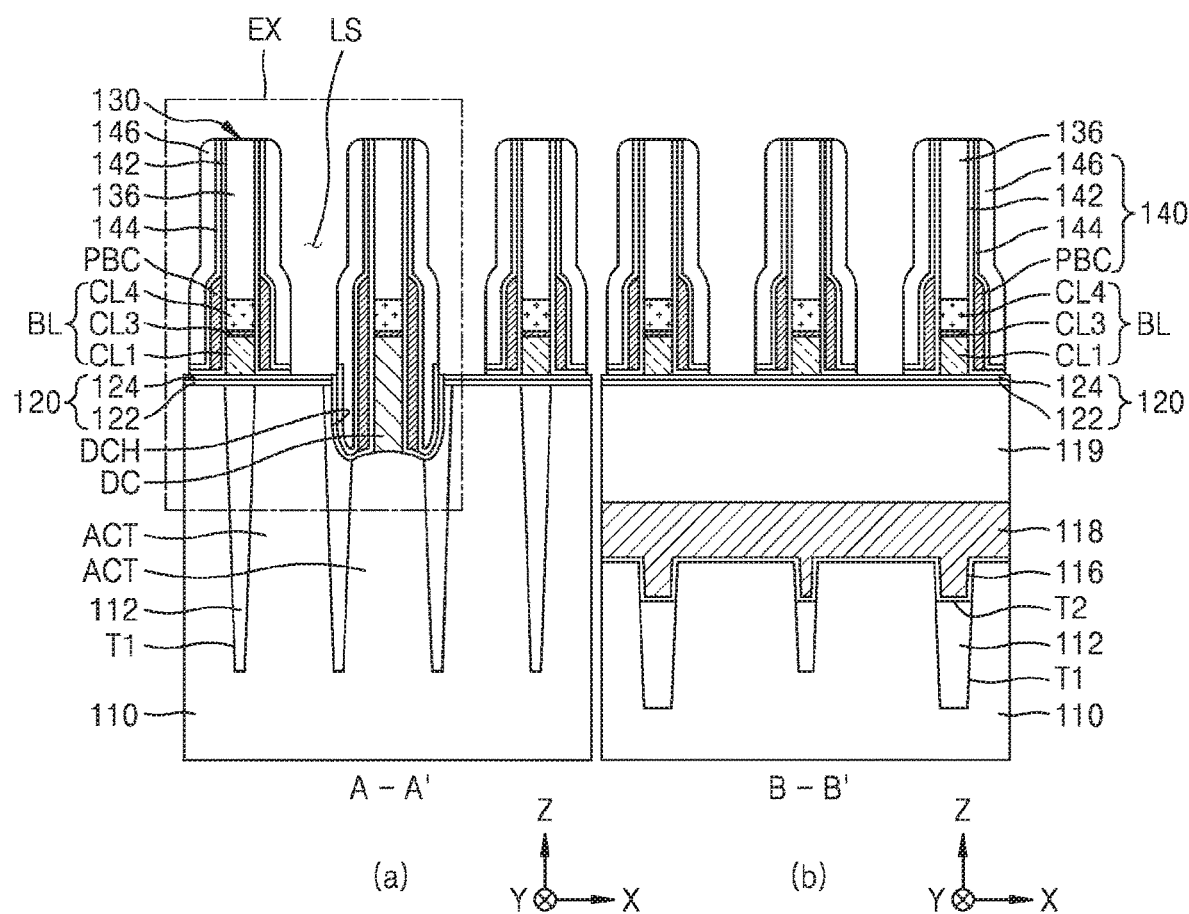
Figure 16B:
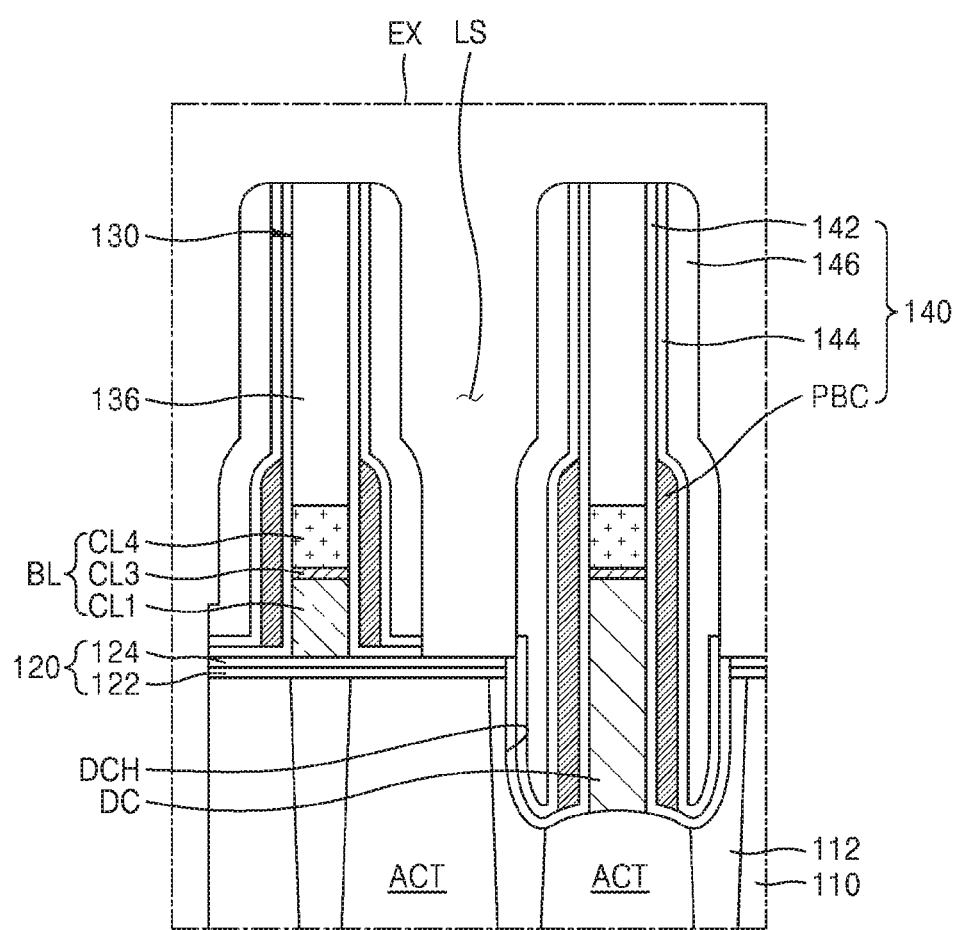

Referring to FIGS. 16A and 16B, the second insulating spacer film 146L is etched back to form a plurality of second insulating spacers 146 each covering a side wall of one of a plurality of the conductive line structures 130.

After the second insulating spacers 146 are formed, the first insulating spacer film 144L are divided into a plurality of first insulating spacers 144, and a line space LS extending in the Y-direction on the insulating film 120 may be defined between two adjacent conductive line structures 130.

Figure 17:
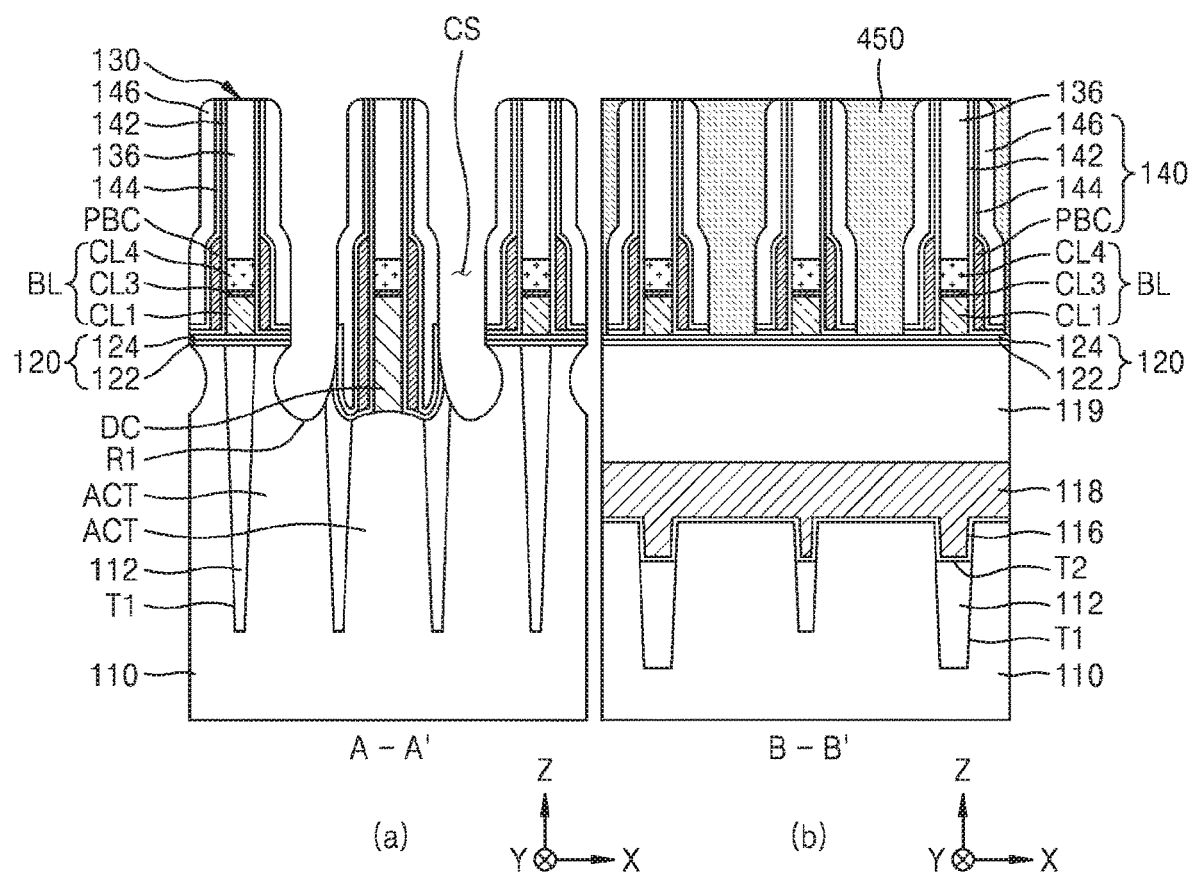

Referring to FIG. 17, a plurality of insulating fences 450 may be formed to divide the line space LS between two adjacent conductive line structures 130 into a plurality of contact spaces CS. Each of the insulating fences 450 may have a form of an insulating plug formed on each word line 118 to vertically overlap the word line 118. Accordingly, the line space LS may be divided into a plurality of the contact spaces CS having a pillar shape by the insulating fences 450 formed in the line space LS. The insulating fences 450 may be formed of a silicon nitride film. In some embodiments, while the insulating fences 450 are being formed, a plurality of the insulating capping patterns 136 and surrounding films may be exposed to an etching atmosphere involved in the formation of the insulating fences 450 and thus partially consumed, and therefore, the heights of the insulating capping patterns 136 and the surrounding films may be partially decreased.

Thereafter, structures exposed through the contact spaces CS are partially removed to form a plurality of recesses R1. Each of the recesses R1 is between two adjacent bit lines BL and exposes an active region ACT of the substrate 110.

Anisotropic etching, isotropic etching, or a combination thereof may be used to form the recesses R1. For example, anisotropic etching may be performed to sequentially etch the second insulating film 124 and the first insulating film 122 among the structures exposed through the contact spaces CS, and the active regions ACT of the substrate 110 exposed as the result of etching the first insulating film 122 may be partially removed using isotropic etching to form the recesses R1. The recesses R1 may respectively connect with the contact spaces CS. The active regions ACT of the substrate 110 may be exposed through the recesses R1.

Figure 18:
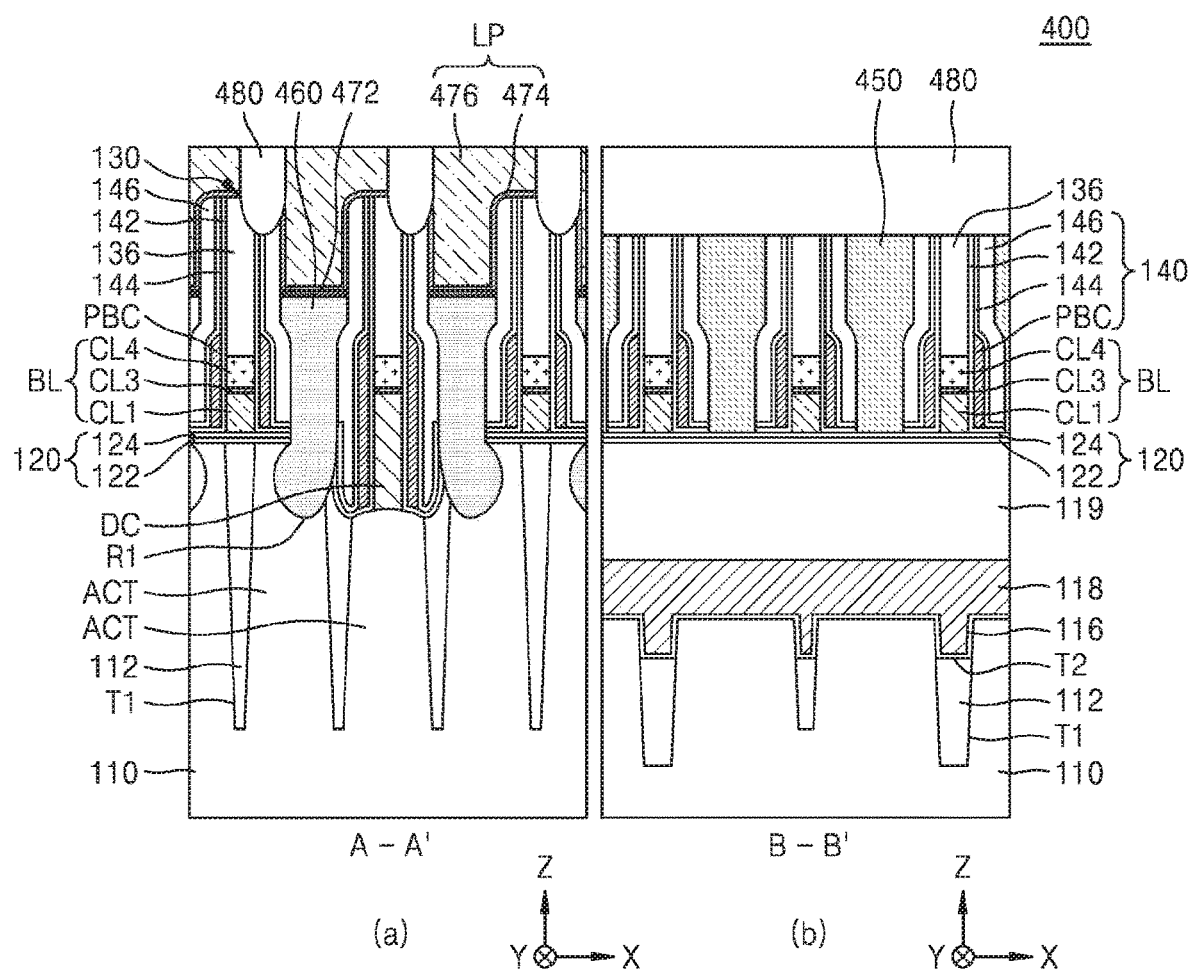

Referring to FIG. 18, a plurality of conductive plugs 460 are formed to fully fill the recesses R1 and partially fill the contact spaces CS between the bit lines BL.

To form the conductive plugs 460, a conductive layer may be formed to fill the recesses R1 and the contact spaces CS in the resultant structure shown in FIG. 17 and to cover the top surface of the insulating capping patterns 136 and the insulating fences 450. Thereafter, an upper portion of the conductive layer may be etched back to expose the top surfaces of the insulating capping patterns 136 and the insulating fences 450 and re-empty an upper inlet portion of each of the contact spaces CS. Remaining portions of the conductive layer may form the conductive plugs 460. The conductive plugs 460 may be formed of a doped polysilicon.

A plurality of metal silicide films 472 and a plurality of conductive landing pads LP are sequentially formed on the conductive plugs 460. The conductive landing pads LP may be formed on the metal silicide films 472 to extend above the insulating capping patterns 136, thereby filling the contact spaces CS (see FIG. 17) and vertically overlapping part of the conductive line structures 130. Each of the conductive landing pads LP may include a conductive barrier film 474 and a conductive layer 476 formed on the conductive barrier film 474 to fill the remaining spaces of the contact spaces CS and extend above the conductive line structures 130. The conductive barrier film 474 may have a Ti/TiN stack structure. The conductive layer 476 may be formed of metal, metal nitride, conductive polysilicon, or a combination thereof. In some embodiments, the conductive layer 476 may include W.

A mask pattern (not shown) exposing part of the conductive layer 476 may be formed on the conductive layer 476. Thereafter, the conductive barrier film 474, the conductive layer 476, and surrounding insulating films may be etched using the mask pattern as an etch mask, so that remaining portions of the conductive barrier film 474 and the conductive layer 476 may form the conductive landing pads LP. The mask pattern may be formed of a silicon nitride film, but the inventive concepts are not limited thereto. The conductive landing pads LP may be a plurality of island pad patterns. In some embodiments, around the conductive landing pads LP, the insulating capping patterns 136 and the insulating spacers 140 covering the side walls of thereof may be partially removed by an etching atmosphere involved in the formation of the conductive landing pads LP, so that the heights of some portions of the insulating capping patterns 136 and the insulating spacers 140 may be decreased.

Empty spaces around the conductive landing pads LP may be filled with an insulating film 480 to electrically insulate the conductive landing pads LP from one another. Thereafter, a capacitor lower electrode may be formed on the insulating film 480 to be electrically connectable and/or connected to each of the conductive landing pads LP.

Although an exemplary method of manufacturing the integrated circuit device 400 has been described with reference to FIGS. 4 through 18, various modifications and/or changes may be made in the method described above to manufacture integrated circuit devices having various structures. For example, it will be understood by those skilled in the art that the integrated circuit devices 100 and 200 shown in FIGS. 2A through 3 and other various modifications may be manufactured based on the descriptions made with reference to FIGS. 4 through 18.

According to the embodiment described with reference to FIGS. 4 through 18, a structure may be obtained in which an insulating spacer 140 including a char spacer PBC having very low permittivity (e.g., a permittivity of about 3 or less, e.g., less than about 3, 2.5, 2, or 1.5) is between a conductive line structure 130 and a conductive plug 460 and extends in a length direction of a bit line BL, and so the load capacitance between a plurality of conductive patterns in a cell miniaturized due to high integration density may be minimized. In addition, in some embodiments, processes according to embodiments of the present inventive concepts of forming a char spacer PBC having a very low permittivity between the conductive line structure 130 and the conductive plug 460 are performed before the metal silicide film 472 and the conductive landing pads LP are formed. Accordingly, a separate process of forming an air spacer having low permittivity at the insulating spacer 140 is not necessary after the metal silicide film 472 and the conductive landing pads LP are formed. As a result, transmission of contamination through an air spacer occurring during the formation of the air spacer is prevented, so that the quality degradation of an integrated circuit device may be prevented.

According to embodiments of the inventive concepts, an integrated circuit device includes an insulating spacer, which includes a char spacer having very low permittivity (e.g., a permittivity of about 3 or less, e.g., less than about 3, 2.5, 2, or 1.5), between a conductive line structure and a contact structure, thereby providing a structure minimizing load capacitance between a plurality of conductive patterns in a cell miniaturized due to high integration density.

In a method of manufacturing an integrated circuit device according to some embodiments of the inventive concepts, processes of forming a char spacer having very low permittivity (e.g., a permittivity of about 3 or less, e.g., less than about 3, 2.5, 2, or 1.5) between a conductive line structure and a plurality of conductive plugs are performed before a metal silicide film and a conductive landing pad are formed. Accordingly, a separate process of forming an air spacer having low permittivity at an insulating spacer is not necessary after the metal silicide film and a conductive landing pad are formed. As a result, transmission of contamination through an air spacer occurring during the formation of the air spacer is prevented, so that the quality degradation of the integrated circuit device may be prevented.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

The terminology used herein is for the purpose of describing particular embodiments only and is not intended to be limiting of example embodiments. As used herein, the singular forms "a," "an," and "the" are intended to include the plural forms as well, unless the context clearly indicates otherwise.

As used herein, the term "and/or" includes any and all combinations of one or more of the associated listed items.

The term "about" as used herein when referring to a measurable value such as an amount or concentration and the like, is meant to encompass variations of ±10%, ±5%, ±1%, ±0.5%, or even ±0.1% of the specified value as well as the specified value. For example, "about X" where X is the measurable value, is meant to include X as well as variations of ±10%, ±5%, ±1%, ±0.5%, or even ±0.1% of X. A range provided herein for a measureable value may include any other range and/or individual value therein.

While the inventive concepts have been particularly shown and described with reference to embodiments thereof, it will be understood that various changes in form and/or details may be made therein without departing from the spirit and scope of the following claims.

What is claimed is:

1. A method of manufacturing an integrated circuit device, the method comprising:
   forming a conductive line on a substrate;
   forming an inner spacer on the conductive line;
   forming a polymer brush pattern chemically bonded to the inner spacer;
   forming an insulating spacer film on the polymer brush pattern, the polymer brush pattern being enclosed by the inner spacer and the insulating spacer film so that the polymer brush pattern is not exposed; and
   forming a char spacer from the polymer brush pattern by pyrolyzing the polymer brush pattern.

2. The method of claim 1, wherein the forming of the char spacer is performed in the absence of oxygen.

3. The method of claim 1, wherein the forming of the polymer brush pattern comprises:
   forming a polymer composite layer on the inner spacer, the polymer composite layer comprising a fixing polymer having an anchoring group;
   thermally processing the polymer composite layer such that the fixing polymer is grafted onto the inner spacer; and
   removing an unreacted portion of the polymer composite layer.

4. The method of claim 1, wherein the forming of the polymer brush pattern comprises:
   covalently bonding a hydroxyl-terminated polystyrene brush to a surface of the inner spacer.

5. The method of claim 1, wherein the polymer brush pattern comprises a plurality of graft polymers each having a first end that is fixed to a surface of the inner spacer and a second end that is opposite the first end, wherein the second end is not fixed to anything.

6. A method of manufacturing an integrated circuit device, the method comprising:

forming a conductive line structure on a substrate, the conductive line structure comprising a conductive line and an insulating capping pattern covering the conductive line;

forming an inner spacer covering a side wall of the conductive line structure;

forming a polymer brush pattern chemically bonded to the inner spacer to cover a side wall of the conductive line;

forming a first insulating spacer film on the side wall of the conductive line structure to cover the inner spacer and the polymer brush pattern; and forming a char spacer from the polymer brush pattern by pyrolyzing the polymer brush pattern in the absence of oxygen.

7. The method of claim 6, wherein the forming of the polymer brush pattern comprises:

forming a polymer composite layer on at least a portion of a side wall of the inner spacer, the polymer composite layer comprising a fixing polymer having an anchoring group;

thermally processing the polymer composite layer such that the fixing polymer is grafted onto the portion of the side wall of the inner spacer; and removing an unreacted portion of the polymer composite layer.

8. The method of claim 7, wherein the fixing polymer comprises a vinyl polymer.

9. The method of claim 7, wherein the fixing polymer comprises at least one selected from an aromatic hydrocarbon polymer, a (meth)acrylic polymer, a vinylpyridine polymer, a vinylester polymer, a vinylpyrrolidone polymer, an olefin polymer, copolymers thereof, and combinations thereof.

10. The method of claim 6, wherein the polymer brush pattern is surrounded by the inner spacer and the first insulating spacer film so that the polymer brush pattern is not exposed after the forming of the first insulating spacer film.

11. The method of claim 6, wherein the polymer brush pattern is formed to extend in a vertical direction toward the substrate to a level lower than a top surface of the substrate.

12. The method of claim 6, wherein the polymer brush pattern comprises a plurality of graft polymers each having a first end that is fixed to a surface of the inner spacer and a second end that is opposite the first end, wherein the second end is not fixed to anything.

13. The method of claim 6, further comprising forming a second insulating spacer film on the first insulating spacer film to cover the side wall of the conductive line structure after the forming of the first insulating spacer film, and wherein the forming of the char spacer is performed simultaneously with the forming of the second insulating spacer film.

14. The method of claim 13, wherein the first insulating spacer film comprises a different material than the second insulating spacer film.

15. A method of manufacturing an integrated circuit device, the method comprising:

forming a plurality of conductive line structures each comprising a bit line extending on a substrate in a first horizontal direction and an insulating capping pattern covering the bit line;

forming an inner spacer covering side walls of the plurality of conductive line structures;

forming a plurality of polymer brush patterns chemically bonded to the inner spacer, the plurality of polymer brush patterns covering the side walls of the plurality of conductive line structures;

forming a first insulating spacer film on the side walls of the plurality of conductive line structures, the first insulating spacer film covering the inner spacer and the plurality of polymer brush patterns; and forming a plurality of char spacers from the plurality of polymer brush patterns by pyrolyzing the plurality of polymer brush patterns.

16. The method of claim 15, wherein the forming of the plurality of polymer brush patterns comprises:

forming a polymer composite layer on the inner spacer by coating a polymer composite including a fixing polymer having an anchoring group on the inner spacer;

forming a polymer brush layer on the inner spacer by thermally processing the polymer composite layer to induce a reaction between the anchoring group of the fixing polymer and a surface of the inner spacer so that the fixing polymer is grafted onto the surface of the inner spacer;

removing an unreacted portion of the polymer composite layer to expose an outer wall of the polymer brush layer; and forming the plurality of polymer brush patterns by removing unnecessary portions of the polymer brush layer, each of the plurality of polymer brush patterns covering a side wall of the bit line.

17. The method of claim 16, wherein the forming of the polymer brush layer comprises:

inducing a condensation reaction between a hydroxyl group on the surface of the inner spacer and a hydroxyl group of the anchoring group of the fixing polymer.

18. The method of claim 15, wherein the forming of the plurality of char spacers is performed at about 250° C. to about 1,000° C. in the absence of oxygen.

19. The method of claim 15, further comprising forming a second insulating spacer film on the first insulating spacer film to cover the side walls of the plurality of conductive line structures after the forming of the first insulating spacer film, and wherein the forming of the plurality of char spacers is performed simultaneously with the forming of the second insulating spacer film.

20. The method of claim 19, wherein the inner spacer comprises a silicon nitride film, the first insulating spacer film comprises a silicon oxide film, and the second insulating spacer film comprises a silicon nitride film or a SiCN film.

* * * * *